(12) United States Patent
Osaki et al.

(10) Patent No.: US 9,594,303 B2
(45) Date of Patent: Mar. 14, 2017

(54) RESIST PATTERN-FORMING METHOD AND PHOTORESIST COMPOSITION

(71) Applicant: JSR Corporation, Tokyo (JP)

(72) Inventors: Hitoshi Osaki, Tokyo (JP); Hayato Namai, Tokyo (JP); Shinya Minegishi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 69 days.

(21) Appl. No.: 14/491,445

(22) Filed: Sep. 19, 2014

(65) Prior Publication Data

US 2015/0010866 A1 Jan. 8, 2015

Related U.S. Application Data

(63) Continuation of application No. PCT/JP2013/057751, filed on Mar. 18, 2013.

(30) Foreign Application Priority Data

Mar. 19, 2012 (JP) .................................. 2012-062884

(51) Int. Cl.
| | | |
|---|---|---|
| *G03F 7/004* | (2006.01) | |
| *G03F 7/038* | (2006.01) | |
| *H01L 21/027* | (2006.01) | |
| *G03F 7/039* | (2006.01) | |
| *G03F 7/32* | (2006.01) | |
| *G03F 7/20* | (2006.01) | |
| *C08F 220/26* | (2006.01) | |
| *C08F 220/34* | (2006.01) | |
| *G03F 7/11* | (2006.01) | |
| *C08F 220/18* | (2006.01) | |

(52) U.S. Cl.
CPC ............ *G03F 7/038* (2013.01); *C08F 220/26* (2013.01); *C08F 220/34* (2013.01); *G03F 7/0045* (2013.01); *G03F 7/0382* (2013.01); *G03F 7/0397* (2013.01); *G03F 7/2041* (2013.01); *G03F 7/325* (2013.01); *H01L 21/0275* (2013.01); *C08F 220/18* (2013.01); *G03F 7/11* (2013.01)

(58) Field of Classification Search
CPC .... G03F 7/0045; G03F 7/0397; G03F 7/2041; C08F 220/18; C08F 220/26; C08F 220/34; C08F 220/38; H01L 21/0275
USPC ..... 430/270.1, 322, 325, 326, 229; 526/259, 526/310
See application file for complete search history.

(56) References Cited

U.S. PATENT DOCUMENTS

| | | | |
|---|---|---|---|
| 4,491,628 A | 1/1985 | Ito et al. | |
| 4,910,122 A | 3/1990 | Arnold et al. | |
| 5,744,537 A | 4/1998 | Brunsvold et al. | |
| 6,057,080 A | 5/2000 | Brunsvold et al. | |
| 8,426,108 B2* | 4/2013 | Masunaga ............. | G03F 7/0392 430/270.1 |
| 8,758,978 B2* | 6/2014 | Satou ...................... | C08F 20/34 430/270.1 |
| 9,122,152 B2* | 9/2015 | Hatakeyama ............ | G03F 7/38 |
| 9,268,225 B2* | 2/2016 | Tanaka .................. | C07C 69/734 |
| 2005/0277059 A1 | 12/2005 | Kanda | |
| 2009/0011365 A1* | 1/2009 | Kobayashi ............ | G03F 7/0046 430/284.1 |
| 2011/0200942 A1* | 8/2011 | Masunaga ............. | G03F 7/0382 430/285.1 |
| 2012/0070778 A1* | 3/2012 | Ichikawa ................ | C08F 20/06 430/270.1 |
| 2012/0183904 A1* | 7/2012 | Sagehashi ............. | G03F 7/0045 430/285.1 |
| 2012/0245318 A1* | 9/2012 | Nakaya .................. | C08F 220/14 526/263 |
| 2012/0282548 A1* | 11/2012 | Enomoto ............. | G03F 7/0045 430/284.1 |
| 2014/0004467 A1* | 1/2014 | Hirano .................. | C08F 220/28 430/311 |
| 2014/0093826 A1* | 4/2014 | Minegishi ............. | C08F 214/18 430/325 |
| 2014/0234785 A1* | 8/2014 | Hatakeyama ............. | G03F 7/40 430/326 |
| 2014/0235057 A1* | 8/2014 | Hatakeyama ............. | G03F 7/00 438/702 |

FOREIGN PATENT DOCUMENTS

| | | | |
|---|---|---|---|
| JP | 57-178238 A | 11/1982 | |
| JP | 59-45439 A | 3/1984 | |

(Continued)

OTHER PUBLICATIONS

Office Action issued Jun. 14, 2016 in Japanese Patent Application No. 2014-506234 (w/ English translation).
Office Action issued Jun. 23, 2016 in Taiwanese Patent Application No. 102109631 (w/ English translation).
Taiwanese Office Action issued Sep. 21, 2016 in Patent Application No. 102109631 (with English translation).
Office Action issued Nov. 22, 2016, in Japanese Patent Application No. 2014-506234 (w/ English translation).
International Search Report issued May 21, 2013 in PCT/JP2013/057751 filed Mar. 18, 2013.

*Primary Examiner* — Amanda C Walke
(74) *Attorney, Agent, or Firm* — Oblon, McClelland, Maier & Neustadt, L.L.P.

(57) ABSTRACT

A resist pattern-forming method includes forming a resist film using a photoresist composition. The resist film is exposed. The exposed resist film is developed. The photoresist composition includes an acid generator and a polymer. The acid generator generates a protonic acid upon application of exposure light. The protonic acid generates a proton. The polymer includes a first structural unit which includes a first group. The first group and the proton form a cationic group. The polymer substantially does not include a structural unit which includes an acid-labile group.

9 Claims, No Drawings

(56) References Cited

FOREIGN PATENT DOCUMENTS

| | | | |
|---|---|---|---|
| JP | 59-93448 A | | 5/1984 |
| JP | 2-118651 A | | 5/1990 |
| JP | 05140880 A | * | 6/1993 |
| JP | 05-188598 A | | 7/1993 |
| JP | 06-12452 B2 | | 2/1994 |
| JP | 2000-199953 A | | 7/2000 |
| JP | 2005-352384 A | | 12/2005 |
| JP | 2009-31767 A | | 2/2009 |
| JP | 2009-237170 A | | 10/2009 |
| JP | 2011-141494 A | | 7/2011 |

* cited by examiner

RESIST PATTERN-FORMING METHOD AND PHOTORESIST COMPOSITION

CROSS-REFERENCE TO RELATED APPLICATIONS

The present application is a continuation application of International Application No. PCT/JP2013/057751, filed by Mar. 18, 2013, which claims priority to Japanese Patent Application No. 2012-062884, filed Mar. 19, 2012. The contents of these applications are incorporated herein by reference in their entirety.

BACKGROUND OF THE INVENTION

Field of the Invention

The invention relates to a resist pattern-forming method and a photoresist composition.

Discussion of the Background

A chemically-amplified photoresist composition is normally designed so that an acid is generated in the exposed area upon application of electromagnetic radiation (e.g., deep ultraviolet rays (e.g., ArF excimer laser light or KrF excimer laser light) or charged particle rays (e.g., electron beams)), and a difference in solubility in a developer occurs between the exposed area and the unexposed area due to the effect of the acid. A resist pattern is formed on a substrate utilizing the above phenomenon.

A photoresist composition that includes an acid generator that generates an acid upon application of exposure light, and a polymer that includes an acid-labile group has been normally used so that a difference in solubility in a developer occurs between the exposed area and the unexposed area. When such a photoresist composition is used, an acid generated by the acid generator serves as a catalyst, and the acid-labile group dissociates to produce a carboxyl group or the like. As a result, the solubility of the polymer in the developer (e.g., alkaline aqueous solution or an organic solvent) changes, and dissolution contrast occurs between the exposed area and the unexposed area, so that a resist pattern that exhibits excellent lithographic properties can be formed (see Japanese Patent Application Publication (KOKAI) No. 59-45439 and Japanese Patent Application Publication (KOKAI) No. 2000-199953).

In recent years, it has been desired to form a finer pattern in higher yield. In particular, an improvement in exposure latitude (EL) performance, mask error enhancement factor (MEEF) performance, and resolution of the resist pattern has been desired.

SUMMARY OF THE INVENTION

According to one aspect of the present invention, a resist pattern-forming method includes forming a resist film using a photoresist composition. The resist film is exposed. The exposed resist film is developed. The photoresist composition includes an acid generator and a polymer. The acid generator generates a protonic acid upon application of exposure light. The protonic acid generates a proton. The polymer includes a first structural unit which includes a first group. The first group and the proton form a cationic group. The polymer substantially does not include a structural unit which includes an acid-labile group.

According to another aspect of the present invention, a photoresist composition includes an acid generator and a polymer. The acid generator generates a protonic acid upon application of exposure light. The polymer includes a first structural unit which includes a first group. The first group and a proton generated from the protonic acid form a cationic group. The polymer substantially does not include a structural unit which includes an acid-labile group.

DESCRIPTION OF THE EMBODIMENTS

According to one embodiment of the invention, a resist pattern-forming method includes:

forming a resist film using a photoresist composition;
exposing the resist film; and
developing the exposed resist film,
the photoresist composition (hereinafter may be referred to as "photoresist composition (I)") including:
an acid generator that generates a protonic acid upon application of exposure light (hereinafter may be referred to as "acid generator [A]"); and
a polymer that includes a structural unit including a group (a) that forms a cationic group together with a proton (hereinafter may be referred to as "structural unit (I)"), and substantially does not include a structural unit including an acid-labile group (hereinafter may be referred to as "polymer [B]").

The resist pattern-forming method that utilizes the photoresist composition (I) that includes the acid generator [A] and the polymer [B] can form a resist pattern that exhibits excellent EL performance, excellent MEEF performance, and high resolution. It is conjectured that the above effects are obtained for the following reasons, for example. Specifically, the acid generator [A] generates a protonic acid upon application of exposure light. The proton included in the protonic acid forms a cationic group together with the group (a) included in the polymer [B] to form a salt of the polymer [B] and the protonic acid, so that the solubility of the polymer [B] in the developer changes in the exposed area. As a result, dissolution contrast occurs between the exposed area and the unexposed area. Since the dissolution contrast occurs between the polymer [B] and the salt thereof, the dissolution contrast is higher than that occurs between an ester group and a carboxyl group or the like due to dissociation of an acid-labile group included in a known polymer. Therefore, the resist pattern-forming method that utilizes the photoresist composition (I) can form a resist pattern that exhibits excellent EL performance. The resist pattern-forming method can moderately reduce the diffusion length of the acid generated by the acid generator [A] utilizing the group (a) included in the polymer [B], and improve the resolution and the MEEF performance. Since the resist pattern-forming method ensures that dissolution contrast occurs due to formation of a cation by the group (a) and the proton, the amount of activation energy required is smaller than that of a resist pattern-forming method that utilizes dissociation of an acid-labile group included in a polymer. This makes it possible to omit post-exposure bake (PEB) after exposure, and improve throughput.

It is preferable that the group (a) include at least one atom selected from the group consisting of a nitrogen atom having an unshared electron pair and a phosphorus atom having an unshared electron pair.

When the group (a) includes the above specific atom, it is possible to improve the cationic group-forming capability by the group (a) and the proton, and improve the EL performance, the MEEF performance, and the resolution.

It is preferable that the group (a) be at least one group selected from the group consisting of a group represented by the following formula (a-1), a group represented by the following formula (a-2), and a group represented by the following formula (a-3).

(a-1)

(a-2)

(a-3)

wherein Z is independently a nitrogen atom or a phosphorus atom, and R, R', and R" are independently a hydrogen atom or a monovalent organic group having 1 to 20 carbon atoms, provided that R and R' optionally bond to each other to form a cyclic structure together with Z to which R and R' are bonded.

When the group (a) is a group having the above specific structure, it is possible to further improve the cationic group-forming capability by the group (a) and the proton, and further improve the EL performance, the MEEF performance, and the resolution.

It is preferable that the group represented by the formula (a-1) be at least one group selected from the group consisting of a group represented by the following formula (a-1-1), a group represented by the following formula (a-1-2), a group represented by the following formula (a-1-3), a group represented by the following formula (a-1-4), a group represented by the following formula (a-1-5), and a group represented by the following formula (a-1-6), and the group represented by the formula (a-2) be a group represented by the following formula (a-2-1).

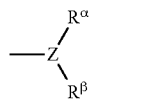
(a-1-1)

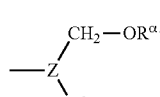
(a-1-2)

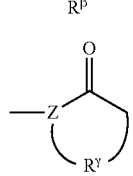
(a-1-3)

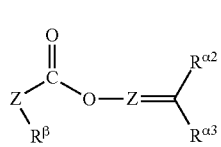
(a-1-4)

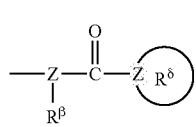
(a-1-5)

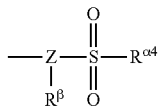
(a-1-6)

(a-2-1)

wherein Z is independently a nitrogen atom or a phosphorus atom, $R^\alpha$, $R^\beta$, $R^{\alpha1}$ to $R^{\alpha3}$, and $R^\epsilon$ are independently a hydrogen atom or a monovalent hydrocarbon group having 1 to 20 carbon atoms, $R^{\alpha4}$ is a monovalent hydrocarbon group having 1 to 20 carbon atoms, $R^\gamma$ is a divalent hydrocarbon group having 1 to 20 carbon atoms or a divalent oxyhydrocarbon group having 1 to 20 carbon atoms, and $R^\delta$ is a substituted or unsubstituted monovalent aromatic heterocyclic group having 3 to 20 carbon atoms and including an atom represented by Z, provided that $R^\alpha$ and $R^\beta$ in the formula (a-1-1), $R^{\alpha1}$ and $R^\beta$ in the formula (a-1-2), and $R^{\alpha2}$ and $R^{\alpha3}$ in the formula (a-1-4) optionally bond to each other to form a cyclic structure.

When the group represented by the formula (a-1) is a group having the above specific structure, and the group represented by the formula (a-2) is a group having the above specific structure, it is possible to further improve the cationic group-forming capability by the group (a) and the proton, and further improve the EL performance, the MEEF performance, and the resolution.

The structural unit (I) is preferably represented by the following formula (1).

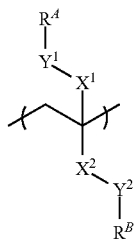
(1)

wherein $X^1$ and $X^2$ are independently a single bond, —O—, —C(O)—, —C(O)O—, —OC(O)O—, —C(O)OC(O)—, —C(O)NH—, —OC(O)NH—, or —SO$_3$—, $Y^1$ and $Y^2$ are independently a single bond or an (n+1)-valent group represented by $R^C(R^X)((L)_p\text{-*})_n$, $R^C$ is an (n+2)-valent chain-like hydrocarbon group having 1 to 15 carbon atoms, $R^X$ is a hydrogen atom or a monovalent organic group having 1 to 20 carbon atoms, L is —O—, —C(O)—, —C(O)O—, —OC(O)O—, —C(O)OC(O)—, —C(O)NH—, —OC(O)NH—, or —SO$_3$—, n is an integer from 1 to 3, p is 0 or 1, provided that a plurality of p are either identical or different when n is 2 or 3, and a plurality of L are either identical or different when a plurality of L are present, * is a site bonded to $R^A$ or $R^B$, and $R^A$ and $R^B$ are independently a hydrogen atom or an n-valent group (a), provided that a case where all of $X^1$, $Y^1$, $X^2$, and $Y^2$ are a single bond is excluded, and at least one of $R^A$ and $R^B$ is an n-valent group (a).

When the structural unit (I) has the above specific structure, it is possible to more easily introduce the structural unit (I) into the polymer [B], and further improve the EL performance, the MEEF performance, and the resolution.

It is preferable that the structural unit (I) be at least one structural unit selected from the group consisting of a structural unit represented by the following formula (1-1), a structural unit represented by the following formula (1-2), a structural unit represented by the following formula (1-3), and a structural unit represented by the following formula (1-4).

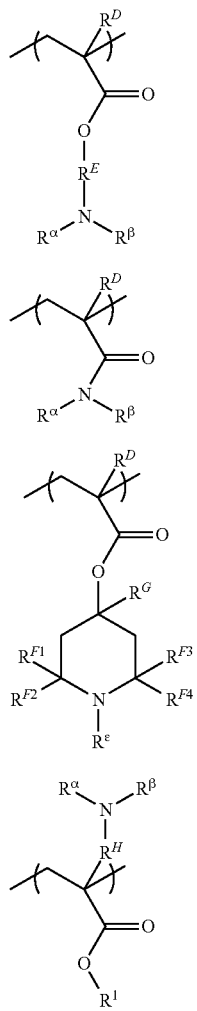

wherein $R^\alpha$, $R^\beta$, and $R^\epsilon$ are independently a hydrogen atom or a monovalent hydrocarbon group having 1 to 20 carbon atoms, $R^D$ is a hydrogen atom or a monovalent chain-like hydrocarbon group having 1 to 5 carbon atoms, $R^E$ is a divalent chain-like hydrocarbon group having 1 to 10 carbon atoms, $R^{F1}$ to $R^{F4}$ are independently a hydrogen atom or a monovalent chain-like hydrocarbon group having 1 to 5 carbon atoms, $R^G$ is a hydrogen atom or a monovalent organic group having 1 to 20 carbon atoms, $R^H$ is a single bond or a divalent chain-like hydrocarbon group having 1 to 10 carbon atoms, and $R^I$ is a monovalent organic group having 1 to 20 carbon atoms.

When the structural unit (I) has the above specific structure, it is possible to more easily introduce the structural unit (I) into the polymer [B], and further improve the EL performance, the MEEF performance, and the resolution.

It is preferable that the polymer [B] further include a structural unit represented by the following formula (2) (hereinafter may be referred to as "structural unit (II)").

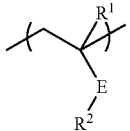

wherein $R^1$ is a hydrogen atom, a fluorine atom, or a monovalent hydrocarbon group having 1 to 20 carbon atoms, E is —O—, —C(O)—, —C(O)O—, —S—, —S(O)—, —S(O)$_2$—, —C(O)S—, or —C(S)O—, and $R^2$ is a non-acid-labile monovalent alicyclic hydrocarbon group having 3 to 20 carbon atoms, provided that some or all of the hydrogen atoms included in the hydrocarbon group represented by $R^1$ and the alicyclic hydrocarbon group represented by $R^2$ are optionally substituted with a halogen atom, a hydroxyl group, a carboxyl group, a nitro group, or an oxo group.

When the polymer [B] included in the photoresist composition further includes the above specific structural unit, it is possible to adjust the properties (e.g., polarity and solubility in a developer) of the polymer [B], and further improve the EL performance, the MEEF performance, and the resolution.

It is preferable that a developer used for the development step include an organic solvent, and the resist pattern-forming method form a negative-tone resist pattern.

It is considered that the dissolution contrast can be further improved by forming a negative-tone resist pattern using the photoresist composition utilizing the developer that includes the organic solvent to form a resist pattern that exhibits more excellent EL performance, more excellent MEEF performance, and higher resolution.

It is preferable that the organic solvent be at least one organic solvent selected from the group consisting of an alcohol-based solvent, an ether-based solvent, a ketone-based solvent, an amide-based solvent, an ester-based solvent, and a hydrocarbon-based solvent.

It is considered that the dissolution contrast can be further improved by utilizing the above specific solvent as the organic solvent included in the developer. This makes it possible to form a resist pattern that exhibits more excellent EL performance, more excellent MEEF performance, and higher resolution.

According to another embodiment of the invention, a photoresist composition includes the acid generator [A] and the polymer [B].

The photoresist composition has the above properties, and exhibits excellent EL performance, excellent MEEF performance, and high resolution.

The photoresist composition may preferably be used to form a negative-tone resist pattern using a developer that includes an organic solvent. Since the photoresist composition achieves dissolution contrast as described above, it is possible to further improve the dissolution contrast when using a developer that includes an organic solvent. Therefore, the photoresist composition can be used to form a resist pattern using a developer that includes an organic solvent, and makes it possible to form a negative-tone resist pattern that exhibits excellent EL performance, excellent MEEF performance, and high resolution.

The term "organic group" used herein refers to a group that includes at least one carbon atom.

As described above, the resist pattern-forming method and the photoresist composition according to the embodiments of the invention can form a resist pattern that exhibits excellent EL performance, excellent MEEF performance, and high resolution. Therefore, the resist pattern-forming method and the photoresist composition can be used to form a pattern in the field of semiconductor devices that will be increasingly scaled down in the future, and can form a finer pattern in higher yield.

The embodiments will now be described in detail.

Resist Pattern-Forming Method

The resist pattern-forming method includes forming a resist film using the photoresist composition (I) (hereinafter may be referred to as "resist film-forming step"), exposing the resist film (hereinafter may be referred to as "exposure step"), and developing the exposed resist film (hereinafter may be referred to as "development step").

The resist pattern-forming method that utilizes the specific photoresist composition (I) can form a resist pattern that exhibits excellent EL performance, excellent MEEF performance, and high resolution.

It is preferable that a developer used for the development step include an organic solvent, and the resist pattern-forming method form a negative-tone resist pattern.

According to the resist pattern-forming method, it is considered that the dissolution contrast can be further improved by forming a negative-tone resist pattern using the photoresist composition (I) utilizing the developer that includes the organic solvent to form a resist pattern that exhibits more excellent EL performance, more excellent MEEF performance, and higher resolution.

Each step of the resist pattern-forming method and the photoresist composition (I) are described below.

Resist Film-Forming Step

In the resist film-forming step, the resist film is formed on a substrate using the photoresist composition (I). A known substrate such as a silicon wafer or an aluminum-coated wafer may be used as the substrate. An organic or inorganic antireflective film disclosed in Japanese Patent Publication (KOKOKU) No. 6-12452, Japanese Patent Application Publication (KOKAI) No. 59-93448, or the like may be formed on the substrate.

The photoresist composition (I) may be applied to the substrate by spin coating, cast coating, roll coating, or the like. The thickness of the resist film is normally 0.01 to 1 µm, and preferably 0.01 to 0.5 µm.

The resist film formed by applying the photoresist composition may optionally be prebaked (PB) to vaporize the solvent. The PB temperature is appropriately selected taking account of the composition of the photoresist composition, but is normally 30 to 200° C., and preferably 50 to 150° C. The PB time is normally 5 to 600 seconds, and preferably 10 to 300 seconds.

A protective film disclosed in Japanese Patent Application Publication (KOKAI) No. 5-188598 or the like may be formed on the resist layer in order to prevent the effects of basic impurities contained in the environmental atmosphere, for example. In order to prevent outflow of the acid generator and the like from the resist film, a liquid immersion lithography protective film disclosed in Japanese Patent Application Publication (KOKAI) No. 2005-352384 or the like may also be formed on the resist film. Note that these techniques may be used in combination.

Exposure Step

In the exposure step, the resist film formed by the resist film-forming step is exposed. The desired area of the resist film is subjected to reduction projection exposure through a mask having a specific pattern and an optional immersion liquid. For example, the desired area of the resist film may be subjected to reduction projection exposure through an isolated line pattern mask to form an isolated trench pattern. The resist film may be exposed a plurality of times using the desired pattern mask and another pattern mask. In this case, it is preferable to continuously (successively) expose the resist film. For example, the desired area of the resist film may be subjected to first reduction projection exposure through a line-and-space pattern mask, and then subjected to second reduction projection exposure so that the exposed areas (lines) intersect. It is preferable that the area subjected to the first reduction projection exposure perpendicularly intersect the area subjected to the second reduction projection exposure. This makes it possible to easily form a circular contact hole pattern in the unexposed area enclosed by the exposed area. Examples of the immersion liquid used for exposure include water, a fluorine-based inert liquid, and the like. It is preferable that the immersion liquid be transparent to the exposure wavelength, and have a temperature coefficient of the refractive index as small as possible in order to minimize distortion of the optical image projected onto the film. In particular, when using ArF excimer laser light (wavelength: 193 nm) as exposure light, it is preferable to use water (more preferably distilled water) from the viewpoint of availability and ease of handling. When using water as the immersion liquid, a small amount of an additive that decreases the surface tension and increases the surface activity of water may be added to the water. It is preferable that the additive does not dissolve the resist film formed on the wafer, and does not significantly affect the optical coating formed on the bottom surface of the lens.

The exposure light used for exposure is appropriately selected taking account of the type of the acid generator [A]. Examples of the exposure light include ultraviolet rays, deep ultraviolet rays, visible rays, electromagnetic radiation such as X-rays and γ-rays, charged particle rays such as electron beams and α-rays, and the like. Among these, deep ultraviolet rays are preferable. It is more preferable to use ArF excimer laser light (wavelength: 193 nm) or KrF excimer laser light (wavelength: 248 nm). It is still more preferable to use ArF excimer laser light. The exposure conditions (e.g., dose) are appropriately selected taking account of the composition of the photoresist composition, the type of each component, and the like. The pattern-forming method may include a plurality of exposure steps. An identical or different light source may be used in each exposure step. Note that it is preferable to use ArF excimer laser light in the first exposure step.

The resist film may be subjected to post-exposure bake (PEB) after exposure. Since the polymer included in the photoresist composition substantially does not include a structural unit including an acid-labile group, it is unnecessary to promote a dissociation reaction of an acid-labile group. However, PEB ensures that the protonic acid generated by the acid generator [A] or the like and the group (a) included in the polymer [B] reliably form a cationic group. The PEB temperature is normally 30 to 200° C., preferably 30 to 150° C., and more preferably 50 to 100° C. The photoresist composition makes it possible to perform PEB at a low temperature as compared with a photoresist composition that includes a polymer including an acid-labile group, and reduce the amount of energy used to form a resist pattern. Since the photoresist composition achieves dissolution contrast due to formation of a cation by the group (a) and the proton, the amount of activation energy required is small as compared with the case of using a photoresist composition that utilizes dissociation of an acid-labile group included in a polymer. This makes it possible to omit post-exposure bake (PEB) after exposure, and improve throughput.

Development Step

In the development step, the resist film exposed in the exposure step is developed using a developer to form a resist pattern.

An aqueous developer or a developer that includes an organic solvent may be used as the developer. A positive-tone resist pattern is obtained when using the aqueous developer, and a negative-tone resist pattern is obtained when using the developer that includes an organic solvent.

Examples of the aqueous developer include water, an aqueous solution prepared by dissolving an inorganic salt (e.g., sodium chloride) or an organic salt (e.g., quaternary ammonium salt) in water, and the like. The concentration of the aqueous solution is preferably 10 mass % or less. If the concentration of the aqueous solution (alkaline aqueous solution) exceeds 10 mass %, the exposed area may not be dissolved in the developer. An organic solvent may be added to the aqueous developer.

Examples of the developer that includes an organic solvent include a liquid that includes one solvent or two or more solvents among the solvents mentioned later in connection with the solvent [D] included in the photoresist composition, and the like. The organic solvent is preferably at least one organic solvent selected from the group consisting of an alcohol-based solvent, an ether-based solvent, a ketone-based solvent, an amide-based solvent, an ester-based solvent, and a hydrocarbon-based solvent. Among these, a ketone-based solvent, an ether-based solvent, an ester-based solvent, and a hydrocarbon-based solvent are preferable, a chain-like ketone-based solvent, a dialkyl ether-based solvent, an acetate-based solvent, and an alicyclic hydrocarbon-based solvent are more preferable, methyl amyl ketone, diisoamyl ether, butyl acetate, and cyclooctane are still more preferable, and cyclooctane is particularly preferable.

The content of the organic solvent in the developer is preferably 80 mass % or more, more preferably 90 mass % or more, and still more preferably 95 mass % or more. When the content of the organic solvent is within the above range, it is possible to improve the dissolution contrast, and form a resist pattern that exhibits more excellent EL performance, more excellent MEEF performance, and higher resolution. Examples of a component other than the organic solvent include water, silicone oil, and the like.

An appropriate amount of a surfactant may optionally be added to the developer. An ionic or nonionic fluorine-based and/or silicone-based surfactant or the like may be used as the surfactant.

Examples of the development method include a dipping method that immerses the substrate in a bath filled with the developer for a given time, a puddle method that allows the developer to be present on the surface of the substrate for a given time utilizing surface tension, a spray method that sprays the developer onto the surface of the substrate, a dynamic dispensing method that applies the developer to the substrate that is rotated at a constant speed while scanning with a developer application nozzle at a constant speed, and the like.

It is preferable to rinse the resist film with a rinsing agent after the development step in order to remove scum. Water (preferably distilled water) is normally used as the rinsing agent when developing the resist film using an alkaline developer. An organic solvent is normally used as the rinsing agent when developing the resist film using a developer that includes an organic solvent. In this case, a hydrocarbon-based solvent, a ketone-based solvent, an ester-based solvent, an alcohol-based solvent, an amide-based solvent, and the like are preferable, an alcohol-based solvent and an ester-based solvent are more preferable, a monohydric alcohol-based solvent having 6 to 8 carbon atoms is still more preferable, 1-hexanol, 2-hexanol, 2-heptanol, and 4-methyl-2-pentanol are particularly preferable, and 4-methyl-2-pentanol is yet more preferable.

Each component of the rinsing agent may be used either alone or in combination. The water content in the rinsing agent is preferably 10 mass % or less, more preferably 5 mass % or less, and still more preferably 3 mass % or less. When the water content in the rinsing agent is 10 mass % or less, excellent developability can be obtained. Note that a surfactant may be added to the rinsing agent.

Examples of the rinsing method using the rinsing agent include a spin method that applies the rinsing agent to the substrate that is rotated at a constant speed, a dipping method that immerses the substrate in a bath filled with the rinsing agent for a given time, a spray method that sprays the rinsing agent onto the surface of the substrate, and the like.

Photoresist Composition (I)

The photoresist composition (I) used for the resist pattern-forming method includes the acid generator [A] and the polymer [B]. The photoresist composition (I) preferably includes a fluorine atom-containing polymer [C] and a solvent [D], and may include an additional component as long as the advantageous effects of the invention are not impaired.

The photoresist composition (I) is designed so that the acid generator [A] generates a protonic acid upon application of exposure light, and the proton forms a cationic group together with the group (a) included in the polymer [B] to form a salt of the polymer [B] and the protonic acid, so that the solubility of the polymer [B] in the developer changes in the exposed area. As a result, dissolution contrast occurs between the exposed area and the unexposed area. Since the dissolution contrast occurs between the polymer [B] and the salt thereof, it is considered that the dissolution contrast is higher than that occurs between an ester group and a carboxyl group or the like due to dissociation of an acid-labile group included in a known polymer. It is considered that the photoresist composition (I) thus exhibits excellent EL performance. It is considered that the photoresist composition (I) can moderately reduce the diffusion length of the acid generated by the acid generator [A] due to the group (a) included in the polymer [B], and improve the resolution and the MEEF performance. Since the dissolution contrast occurs due to formation of a cation by the group (a) and the proton, the amount of activation energy required is smaller than that of a known photoresist composition that utilizes dissociation of an acid-labile group included in a polymer. This makes it possible to omit post-exposure bake (PEB) after exposure, and improve throughput.

Each component is described below.

Acid Generator [A]

The acid generator [A] is a substance that generates a protonic acid upon application of exposure light. The resulting proton forms a cationic group together with the group (a) included in the polymer [B] to form a salt of the polymer [B] and the protonic acid in the exposed area. A difference in solubility in the developer thus occurs between the exposed area and the unexposed area, and high dissolution contrast is obtained. The acid generator [A] may be included in the photoresist composition as a compound (described below), and/or may be included in a polymer (e.g., polymer [B]).

Examples of the acid generator [A] include onium salt compounds, N-sulfonylimide compounds, halogen-containing compounds, diazoketone compounds, and the like.

Examples of the onium salt compounds include sulfonium salts, tetrahydrothiophenium salts, iodonium salts, phosphonium salts, diazonium salts, pyridinium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-bicyclo[2.2.1]hept-2-yl-1,1-difluoroethanesulfonate, triphenylsulfonium 6-(adamantan-1-ylcarbonyloxy)hexane-1,1,2,2-tetrafluoro-n-hexanesulfonate, triphenylsulfonium 2-(adamantan-1-ylcarbonyloxy)-1,1,3,3,3-pentafluoropropanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylsulfonium 1,1,2,2-tetrafluoro-6-(1-adamantanecarbonyloxy)hexane-1-sulfonate, triphenylsulfonium 2-(1-adamantyl)-1,1-difluoroethanesulfonate, and the like.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like.

Examples of the iodonium salts include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compounds include N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide, and the like.

Among these, onium salts are preferable, and sulfonium salts are more preferable. It is still more preferable to use triphenylsulfonium 6-(adamantan-1-ylcarbonyloxy)-1,1,2,2-tetrafluoro-n-hexane sulfonate, triphenylsulfonium 2-(bicyclo[2.2.1]hept-2-yl)-1,1-difluoroethanesulfonate, 4-cyclohexylphenyldiphenylsulfonium nonafluorobutanesulfonate, triphenylsulfonium nonafluorobutanesulfonate, or triphenylsulfonium 2-(adamantan-1-ylcarbonyloxy)-1,1,3,3,3-pentafluoropropanesulfonate.

The acid generator [A] is preferably used in an amount of 0.1 to 100 parts by mass, more preferably 0.5 to 50 parts by mass, still more preferably 1 to 30 parts by mass, particularly preferably 5 to 20 parts by mass, and yet more preferably 7 to 15 parts by mass, based on 100 parts by mass of the polymer [B]. When the acid generator [A] is used in an amount within the above range, the EL performance, the MEEF performance, and the resolution of the resist pattern formed using the resist pattern-forming method can be improved. If the amount of the acid generator [A] is less than 0.1 parts by mass, the sensitivity of the photoresist composition (I) tends to decrease. If the amount of the acid generator [A] exceeds 100 parts by mass, the pattern-forming capability of the photoresist composition (I) may deteriorate.

Polymer [B]

The polymer [B] includes the structural unit (I), and substantially does not include a structural unit including an acid-labile group. The group (a) that is included in the structural unit (I) included in the polymer [B] forms a cationic group together with a proton generated by the acid generator [A] to form a salt of the polymer [B] and the protonic acid in the exposed area, so that high dissolution contrast occurs between the exposed area and the unexposed area.

It is preferable that the polymer [B] include the structural unit (II) represented by the formula (2) in addition to the structural unit (I). The polymer [B] may include a structural unit (III) that includes at least one structure selected from the group consisting of a lactone structure, a cyclic carbonate structure, and a sultone structure, and may include an additional structural unit other than these structural units. The polymer [B] may include only one type of each structural unit, or may include two or more types of each structural unit. Each structural unit is described below.

Structural Unit (I)

The structural unit (I) includes the group (a) that forms a cationic group together with a proton.

The group (a) is not particularly limited as long as the group (a) forms a cationic group together with a proton. Examples of the group (a) include a group that includes a nitrogen atom having an unshared electron pair, a group that includes a phosphorus atom having an unshared electron pair, and the like.

Examples of the group that includes a nitrogen atom having an unshared electron pair and the group that includes a phosphorus atom having an unshared electron pair, include a monovalent group represented by the following formula (a-1) (hereinafter may be referred to as "group (a-1)"), a divalent group represented by the following formula (a-2) (hereinafter may be referred to as "group (a-2)"), a trivalent group represented by the following formula (a-3) (hereinafter may be referred to as "group (a-3)") (hereinafter may be collectively referred to as "n-valent group (a)"), and the like.

When the group (a) is at least one group selected from the group consisting of the group (a-1), the group (a-2), and the group (a-3), the group (a) exhibits an improved capability to form a cationic group together with a proton, and the EL performance, the MEEF performance, and the resolution of the resist pattern formed using the resist pattern-forming method can be improved.

wherein Z is independently a nitrogen atom or a phosphorus atom, and R, R', and R" are independently a hydrogen atom or a monovalent organic group having 1 to 20 carbon atoms, provided that R and R' optionally bond to each other to form a cyclic structure together with Z to which R and R' are bonded.

Examples of the monovalent organic group having 1 to 20 carbon atoms represented by R, R', and R" include monovalent hydrocarbon groups having 1 to 20 carbon atoms, groups obtained by combining a hydrocarbon group with an oxygen atom, a carbonyl group, a sulfonyl group, a group that includes C=N, a monovalent aromatic heterocyclic group, or the like, and the like.

Examples of the monovalent hydrocarbon groups having 1 to 20 carbon atoms include chain-like hydrocarbon groups having 1 to 20 carbon atoms, alicyclic hydrocarbon groups having 3 to 20 carbon atoms, aromatic hydrocarbon groups having 6 to 20 carbon atoms, and the like.

Examples of the chain-like hydrocarbon groups having 1 to 20 carbon atoms include alkyl groups such as a methyl group, an ethyl group, an n-propyl group, an i-propyl group, an n-butyl group, an i-butyl group, a sec-butyl group, and a t-butyl group; alkenyl groups such as an ethenyl group, a propenyl group, a butenyl group, and a pentenyl group; alkynyl groups such as an ethynyl group, a propynyl group, and a butynyl group; and the like.

Examples of the alicyclic hydrocarbon groups having 3 to 20 carbon atoms include cycloalkyl groups such as a cyclopropyl group, a cyclobutyl group, a cyclopentyl group, a cyclohexyl group, a norbornyl group, and an adamantyl group, cycloalkenyl groups such as a cyclopentenyl group, a cyclohexenyl group, and a norbornenyl group; and the like.

Examples of the aromatic hydrocarbon groups having 6 to 20 carbon atoms include aryl groups such as a phenyl group, a tolyl group, a xylyl group, a naphthyl group, and an anthryl group; aralkyl groups such as a benzyl group, a phenethyl group, and a naphthyl group; and the like.

Examples of the groups obtained by combining a hydrocarbon group with an oxygen atom, a carbonyl group, a sulfonyl group, a group that includes C=N (wherein Z is a nitrogen atom or a phosphorus atom), a monovalent aromatic heterocyclic group, or the like, include an alkoxyalkyl group, an alkoxycarbonyl group, a dialkyliminooxycarbonyl group, a heteroarylcarbonyl group, an alkylsulfonyl group, and the like.

Example of the cyclic structure formed by R and R' together with Z include azacycloalkane structures such as an azacyclopentane structure, an azacyclohexane structure, and an azacyclooctane structure, and lactam structures such as a propiolactam structure, a butyrolactam structure, and a valerolactam structure (when Z is a nitrogen atom); phosphacycloalkane structures such as a phosphacyclopentane structure, a phosphacyclohexane structure, and a phosphacyclooctane structure (when Z is a phosphorus atom); and the like.

R, R', and R" are preferably a hydrogen atom or a chain-like hydrocarbon group, more preferably a hydrogen atom or an alkyl group, still more preferably a hydrogen atom, a methyl group, or an ethyl group, particularly preferably a hydrogen atom or a methyl group, and yet more preferably a methyl group. It is preferable that both R and R' be a chain-like hydrocarbon group, more preferably an alkyl group, and still more preferably a methyl group.

Z is preferably a nitrogen atom since the group (a) exhibits an improved capability to form a cationic group together with the proton.

Examples of the group (a-1) include a group represented by the following formula (a-1-1) (hereinafter may be referred to as "group (a-1-1)"), a group represented by the following formula (a-1-2) (hereinafter may be referred to as "group (a-1-2)"), a group represented by the following formula (a-1-3) (hereinafter may be referred to as "group (a-1-3)"), a group represented by the following formula (a-1-4) (hereinafter may be referred to as "group (a-1-4)"), a group represented by the following formula (a-1-5) (hereinafter may be referred to as "group (a-1-5)"), a group represented by the following formula (a-1-6) (hereinafter may be referred to as "group (a-1-6)"), and the like. Examples of the group (a-2) include a group represented by the following formula (a-2-1) (hereinafter may be referred to as "group (a-2-1)") and the like.

When the group (a-1) is at least one group selected from the group consisting of the group (a-1-1), the group (a-1-2), the group (a-1-3), the group (a-1-4), the group (a-1-5), and the group (a-1-6), and the group (a-2) is the group (a-2-1), the group (a) exhibits an improved capability to form a cationic group together with the proton, and the EL performance, the MEEF performance, and the resolution of the resist pattern formed using the resist pattern-forming method can be further improved.

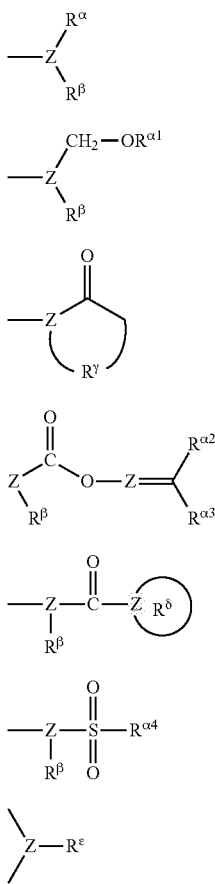

(a-1-1)
(a-1-2)
(a-1-3)
(a-1-4)
(a-1-5)
(a-1-6)
(a-2-1)

wherein Z is independently a nitrogen atom or a phosphorus atom, $R^\alpha$, $R^\beta$, $R^{\alpha 1}$ to $R^{\alpha 3}$, and $R^\epsilon$ are independently a hydrogen atom or a monovalent hydrocarbon group having 1 to 20 carbon atoms, $R^{\alpha 4}$ is a monovalent hydrocarbon group having 1 to 20 carbon atoms, $R^\gamma$ is a divalent hydrocarbon group having 1 to 20 carbon atoms or a divalent oxyhydrocarbon group having 1 to 20 carbon atoms, and $R^\delta$ is a substituted or unsubstituted monovalent aromatic heterocyclic group having 3 to 20 carbon atoms and including an atom represented by Z, provided that $R^\alpha$ and $R^\beta$ in the formula (a-1-1), $R^{\alpha 1}$ and $R^\beta$ in the formula (a-1-2), and $R^{\alpha 2}$ and $R^{\alpha 3}$ in the formula (a-1-4) optionally bond to each other to form a cyclic structure.

Examples of the monovalent hydrocarbon group having 1 to 20 carbon atoms represented by $R^\alpha$, $R^\beta$, $R^{\alpha 1}$ to $R^{\alpha 4}$, and $R^\epsilon$ include those mentioned above in connection with the monovalent hydrocarbon group represented by R and R' in the formula (a-1), and the like.

Examples of the divalent hydrocarbon group having 1 to 20 carbon atoms represented by $R^\gamma$ include a group obtained by removing one hydrogen atom from the monovalent hydrocarbon group having 1 to 20 carbon atoms represented by $R^\alpha$, $R^\beta$, and $R^{\alpha 1}$ to $R^{\alpha 4}$, and the like.

Examples of the divalent oxyhydrocarbon group having 1 to 20 carbon atoms represented by $R^\gamma$ include a group obtained by combining an oxygen atom with a group obtained by removing one hydrogen atom from the monovalent hydrocarbon group having 1 to 20 carbon atoms represented by $R^\alpha$, $R^\beta$, and $R^{\alpha 1}$ to $R^{\alpha 4}$, and the like.

Examples of the monovalent aromatic heterocyclic group represented by $R^\delta$ that includes an atom represented by Z include an azacyclopentadienyl group, a 1,2-diazacyclopentadienyl group, a 1,3-diazacyclopentadienyl group, an azaphenyl group, a 1,2-diazaphenyl group, a 1,3-diazaphenyl group, and a 1,4-diazaphenyl group (when Z is a nitrogen atom); a phosphacyclopentadienyl group, a 1,2-diphosphacyclopentadienyl group, a 1,3-diphosphacyclopentadienyl group, a 1,4-diphosphacyclopentadienyl group, a phosphaphenyl group, a 1,2-diphosphaphenyl group, a 1,3-diphosphaphenyl group, and a 1,4-diphosphaphenyl group (when Z is a phosphorus atom); and the like.

Examples of the cyclic structure formed by $R^\alpha$ and $R^\beta$ in the formula (a-1-1) include an azacyclopentane structure, an azacyclohexane structure, an azacyclooctane structure, an azanorbornane structure, and the like.

Examples of the cyclic structure formed by $R^{\alpha 1}$ and $R^\beta$ in the formula (a-1-2) include an azaoxacyclopentane structure, an azaoxacyclohexane structure, an azaoxacyclooctane structure, an azaoxanorbornane structure, and the like.

Examples of the cyclic structure formed by $R^{\alpha 2}$ and $R^{\alpha 3}$ in the formula (a-1-4) include a cyclopentane structure, a cyclohexane structure, a cyclooctane structure, a norbornane structure, an adamantane structure, and the like.

The group (a-1) is preferably the group represented by the formula (a-1-1), more preferably a dialkylamino group, and still more preferably a dimethylamino group.

The group (a-2) is preferably an imino group (—NH—) or an alkylimino group, more preferably an alkylimino group, and still more preferably a methylimino group.

Examples of the structural unit (I) include a structural unit represented by the following formula (1) (hereinafter may be referred to as "structural unit (I-1)"), and the like.

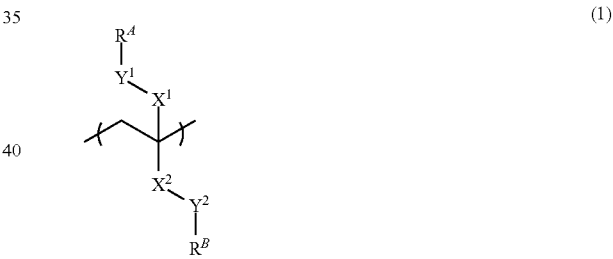

(1)

wherein $X^1$ and $X^2$ are independently a single bond, —O—, —C(O)—, —C(O)O—, —OC(O)O—, —C(O)OC(O)—, —C(O)NH—, —OC(O)NH—, or —SO$_3$—, $Y^1$ and $Y^2$ are independently a single bond or an (n+1)-valent group represented by $R^C(R^X)((L)_p\text{-*})_n$, $R^C$ is an (n+2)-valent chain-like hydrocarbon group having 1 to 15 carbon atoms, $R^X$ is a hydrogen atom or a monovalent organic group having 1 to 20 carbon atoms, L is —O—, —C(O)—, —C(O)O—, —OC(O)O—, —C(O)OC(O)—, —C(O)NH—, —OC(O)NH—, or —SO$_3$—, n is an integer from 1 to 3, p is 0 or 1, provided that a plurality of p are either identical or different when n is 2 or 3, and a plurality of L are either identical or different when a plurality of L are present, * is a site bonded to $R^A$ or $R^B$, and $R^A$ and $R^B$ are independently a hydrogen atom or an n-valent group (a), provided that a case where all of $X^1$, $Y^1$, $X^2$, and $Y^2$ are a single bond is excluded, and at least one of $R^A$ and $R^B$ is an n-valent group (a).

When the structural unit (I) is the structural unit (I-1), it is possible to more easily introduce the structural unit (I) into the polymer [B], and further improve the EL performance, the MEEF performance, and the resolution of the resist pattern formed using the resist pattern-forming method.

When n in the formula (1) is 2 or 3, n bonding sites among the (n+1) bonding sites included in $Y^1$ or $Y^2$ are respectively bonded to n bonding sites included in $R^A$ or $R^B$ to form a cyclic structure including an atom represented by Z.

Examples of the cyclic structure formed by $Y^1$ and $R^A$ or $Y^2$ and $R^B$ when n is 2 include azacycloalkane structures such as an azacyclopentane structure, an azacyclohexane structure, an azacycloheptane structure, and an azacyclooctane structure (when Z is a nitrogen atom); phosphacycloalkane structures such as a phosphacyclopentane structure, a phosphacyclohexane structure, a phosphacycloheptane structure, and a phosphacyclooctane structure (when Z is a phosphorus atom); and the like.

Among these, an azacycloalkane structure is preferable, and an azacyclohexane structure is more preferable.

$X^1$ and $X^2$ are preferably a single bond, —C(O)—, or —C(O)O—, and more preferably —C(O)—, or —C(O)O—.

The (n+1)-valent group represented by $Y^1$ and $Y^2$ when n is 1 (i.e., divalent group) is preferably an alkanediyl group having 1 to 5 carbon atoms or an alkanediyloxycarbonyl group having 2 to 6 carbon atoms, more preferably an alkanediyl group having 1 to 5 carbon atoms, and still more preferably an ethanediyl group.

The (n+1)-valent group represented by $Y^1$ and $Y^2$ when n is 2 (i.e., trivalent group) is preferably an alkanetriyl group having 3 to 12 carbon atoms, more preferably a 2,6-dimethylheptane-2,4,6-triyl group or a pentane-1,3,5-triyl group, and still more preferably a 2,6-dimethylheptane-2,4,6-triyl group.

The (n+1)-valent group represented by $Y^1$ and $Y^2$ when n is 3 (i.e., tetravalent group) is preferably an alkanetetrayl group having 4 to 15 carbon atoms, and more preferably a 3-ethylpentane-1,3,5,7-tetrayl group.

It is preferable that $X^1$ and $Y^1$ respectively be a single bond and a chain-like hydrocarbon group. It is more preferable that $X^1$ and $Y^1$ respectively be a single bond and a methanediyl group.

It is preferable that $X^2$ and $Y^2$ respectively be —CO— and a single bond, or $X^2$ and $Y^2$ respectively be —COO— and a chain-like hydrocarbon group. It is more preferable that $X^2$ and $Y^2$ respectively be —CO— and a single bond, or $X^2$ and $Y^2$ respectively be —COO— and an alkanediyl group or an alkanetriyl group. It is still more preferable that $X^2$ and $Y^2$ respectively be —COO— and an ethanediyl group or a 2,6-dimethylheptane-2,4,6-triyl group.

When the group (a) is a group that includes a nitrogen atom having an unshared electron pair, the structural unit (I-1) is preferably at least one structural unit selected from the group consisting of a structural unit represented by the following formula (1-1) (hereinafter may be referred to as "structural unit (I-1-1)"), a structural unit represented by the following formula (1-2) (hereinafter may be referred to as "structural unit (I-1-2)"), a structural unit represented by the following formula (1-3) (hereinafter may be referred to as "structural unit (I-1-3)"), and a structural unit represented by the following formula (1-4) (hereinafter may be referred to as "structural unit (I-1-4)"). When the structural unit (I) is at least one structural unit selected from the group consisting of the structural unit (I-1-1), the structural unit (I-1-2), the structural unit (I-1-3), and the structural unit (I-1-4), it is possible to more easily introduce the structural unit (I) into the polymer [B], and further improve the EL performance, the MEEF performance, and the resolution of the resist pattern formed using the resist pattern-forming method.

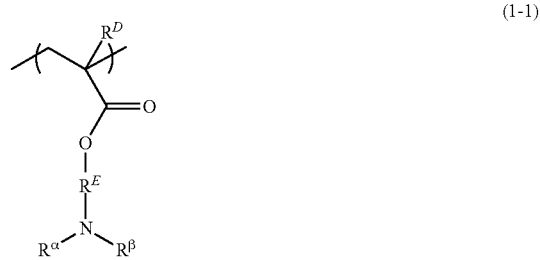

(1-1)

(1-2)

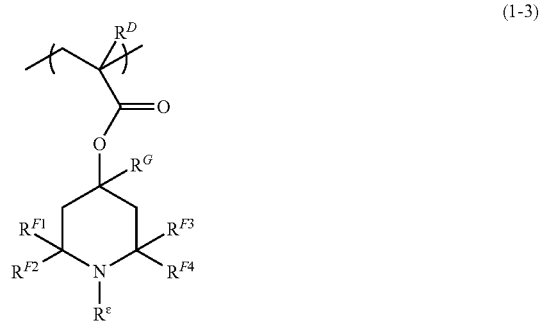

(1-3)

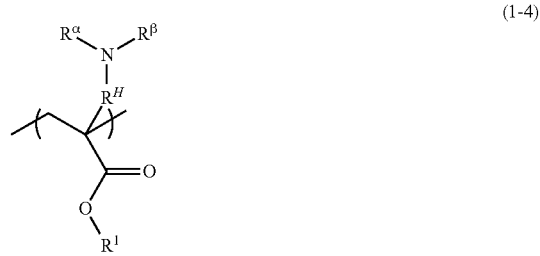

(1-4)

wherein $R^\alpha$, $R^\beta$, and $R^\epsilon$ are independently a hydrogen atom or a monovalent hydrocarbon group having 1 to 20 carbon atoms, $R^D$ is a hydrogen atom or a monovalent chain-like hydrocarbon group having 1 to 5 carbon atoms, $R^E$ is a divalent chain-like hydrocarbon group having 1 to 10 carbon atoms, $R^{F1}$ to $R^{F4}$ are independently a hydrogen atom or a monovalent chain-like hydrocarbon group having 1 to 5 carbon atoms, $R^G$ is a hydrogen atom or a monovalent organic group having 1 to 20 carbon atoms, $R^H$ is a single bond or a divalent chain-like hydrocarbon group having 1 to 10 carbon atoms, and $R^I$ is a monovalent organic group having 1 to 20 carbon atoms.

Examples of the monovalent chain-like hydrocarbon group having 1 to 5 carbon atoms represented by $R^D$ and $R^{F1}$ to $R^{F4}$ include alkyl groups such as a methyl group, an ethyl group, a linear or branched propyl group, a linear or branched butyl group, and a linear or branched pentyl group; alkenyl groups such as an ethenyl group, a linear or branched propenyl group, a linear or branched butenyl group, and a linear or branched pentenyl group; alkynyl groups such as an ethynyl group, a propynyl group, a linear or branched butynyl group, and a linear or branched pentynyl group; and the like.

Examples of the divalent chain-like hydrocarbon group having 1 to 10 carbon atoms represented by $R^E$ and $R^H$ include alkanediyl groups such as a methanediyl group, an ethanediyl group, a propanediyl group, and a butanediyl group; alkenediyl groups such as an ethenediyl group, a propenediyl group, and a butenediyl group; alkynediyl groups such as an ethynediyl group, a propynediyl group, and a butynediyl group; and the like.

Examples of the monovalent organic group having 1 to 20 carbon atoms represented by $R^G$ and $R^I$ include those mentioned above in connection with the monovalent organic group represented by R, R', and R" in the formulas (a-1) to (a-3), and the like.

Examples of the structural unit (I-1) when the group (a) is a group that includes a nitrogen atom having an unshared electron pair include structural units respectively represented by the following formulas, and the like.

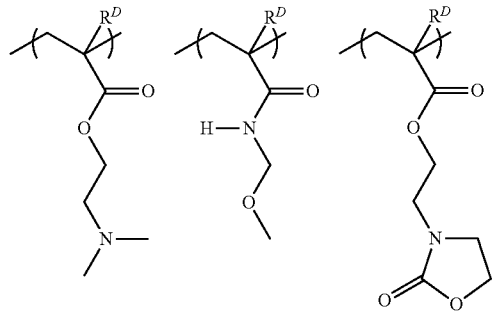

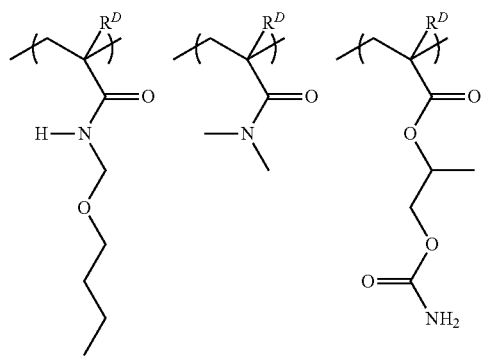

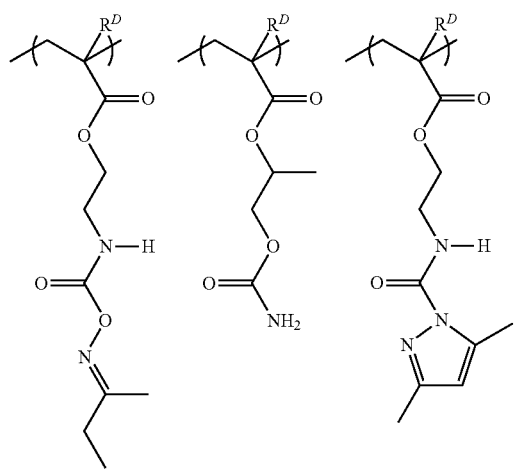

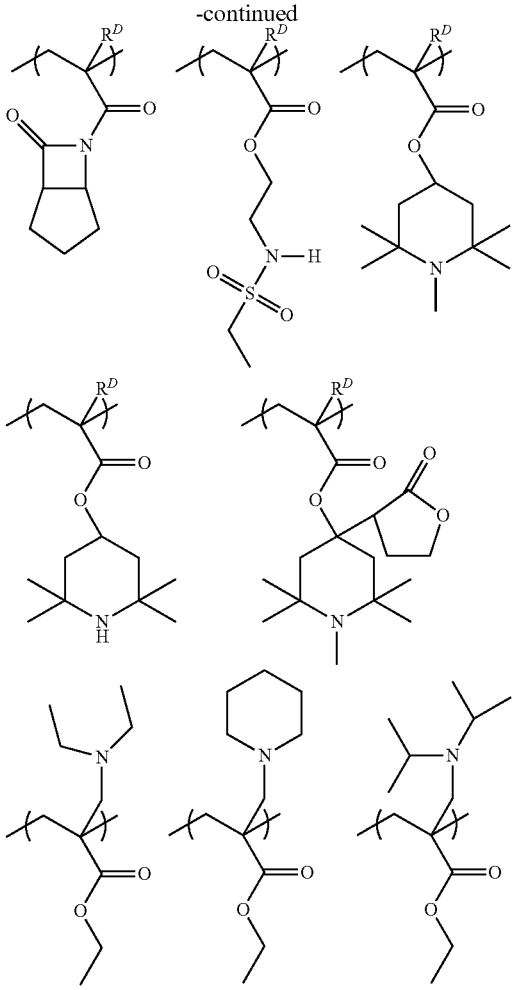

wherein $R^D$ is a hydrogen atom or a monovalent chain-like hydrocarbon group having 1 to 5 carbon atoms.

The structural unit (I) is preferably a structural unit that includes a 2-substituted amino group or a structural unit that includes a cyclic amino group, more preferably a structural unit that includes a dialkylamino group or a structural unit that includes an azacycloalkane ring, still more preferably a structural unit that includes a dimethylamino group or a structural unit that includes a piperidine ring, particularly preferably a structural unit derived from dimethylaminoethyl(meth)acrylate, a structural unit derived from dimethyl(meth)acrylamide, a structural unit derived from 2,2,6,6-tetramethylpiperidin-4-yl(meth)acrylate, or a structural unit derived from 1,2,2,6,6-pentamethylpiperidin-4-yl(meth)acrylate, and yet more preferably a structural unit derived from dimethylaminoethyl(meth)acrylate or a structural unit derived from dimethyl(meth)acrylamide.

Examples of a monomer that produces the structural unit (I) include the compounds respectively represented by the following formulas, and the like.

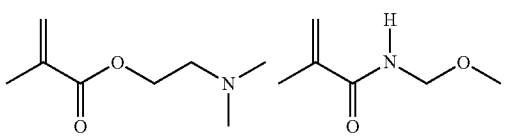

-continued

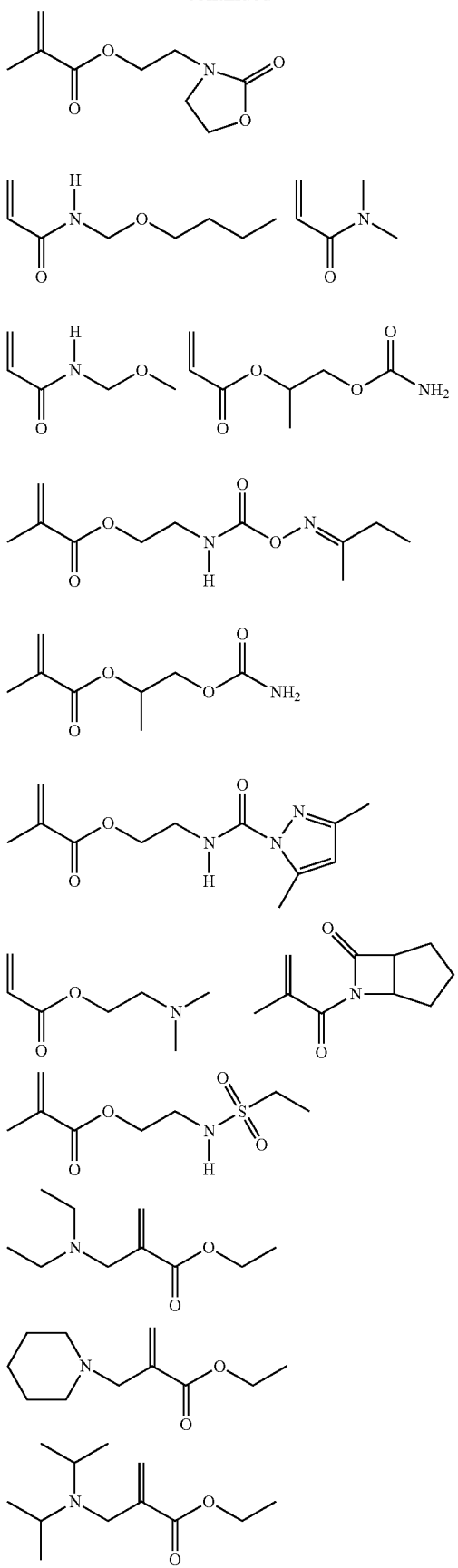

-continued

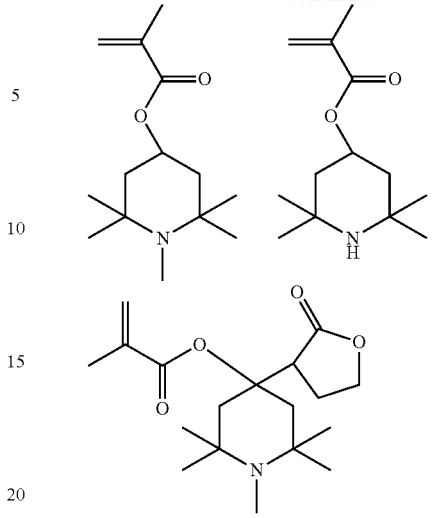

The content of the structural unit (I) in the polymer [B] is preferably 1 to 100 mol %, more preferably 5 to 70 mol %, still more preferably 10 to 50 mol %, and particularly preferably 15 to 35 mol %, based on the total structural units included in the polymer [B]. When the content of the structural unit (I) is within the above range, the EL performance, the MEEF performance, and the resolution of the resist pattern formed using the resist pattern-forming method can be improved. If the content of the structural unit (I) is less than 1 mol %, the sensitivity of the photoresist composition (I) may decrease.

Structural Unit (II)

The structural unit (II) is represented by the formula (2). When the polymer [B] included in the photoresist composition (I) further includes the structural unit (II), it is possible to adjust the properties (e.g., polarity and solubility in a developer) of the polymer [B], and improve the EL performance, the MEEF performance, and the resolution of the resist pattern formed using the resist pattern-forming method.

In the formula (2), $R^1$ is a hydrogen atom, a fluorine atom, or a monovalent hydrocarbon group having 1 to 20 carbon atoms, E is —O—, —C(O)—, —C(O)O—, —S—, —S(O)—, —S(O)$_2$—, —C(O)S—, or —C(S)O—, and $R^2$ is a non-acid-labile monovalent alicyclic hydrocarbon group having 3 to 20 carbon atoms, provided that some or all of the hydrogen atoms included in the hydrocarbon group represented by $R^1$ and the alicyclic hydrocarbon group represented by $R^2$ are optionally substituted with a halogen atom, a hydroxyl group, a carboxyl group, a nitro group, or an oxo group.

Examples of the monovalent hydrocarbon group having 1 to 20 carbon atoms represented by $R^1$ include those mentioned above in connection with R and R' included in the structural unit (I), and the like.

Examples of the halogen atom that may substitute the hydrocarbon group include a fluorine atom, a chlorine atom, a bromine atom, an iodine atom, and the like. The oxo group that may substitute the hydrocarbon group refers to a group obtained by substituting two hydrogen atoms bonded to one carbon atom included in the hydrocarbon group with one oxygen atom. Among these substituents, a fluorine atom, a hydroxyl group, a carboxyl group, and an oxo group are preferable, and a fluorine atom and a hydroxyl group are more preferable.

E preferably represents —O— or —C(O)O—, and more preferably —C(O)O—.

Examples of the non-acid-labile monovalent alicyclic hydrocarbon group having 1 to 20 carbon atoms represented by $R^2$ include monoalicyclic hydrocarbon groups such as a cyclopropyl group, a cyclobutyl group, a cyclopentyl group, a cyclohexyl group, a cyclopentyl group, a cyclooctyl group, a cyclodecyl group, and a cyclododecyl group; polyalicyclic hydrocarbon groups such as a norbornyl group, an adamantyl group, a tricyclodecyl group, and a tetracyclododecyl group; and the like.

Examples of the substituent that may substitute the alicyclic hydrocarbon group represented by $R^2$ include those mentioned above in connection with the hydrocarbon group represented by $R^1$. Among these substituents, a fluorine atom, a hydroxyl group, a carboxyl group, and an oxo group are preferable, and a hydroxyl group and an oxo group are more preferable.

Examples of the structural unit (II) that includes an unsubstituted monovalent alicyclic hydrocarbon group include structural units respectively represented by the following formulas, and the like.

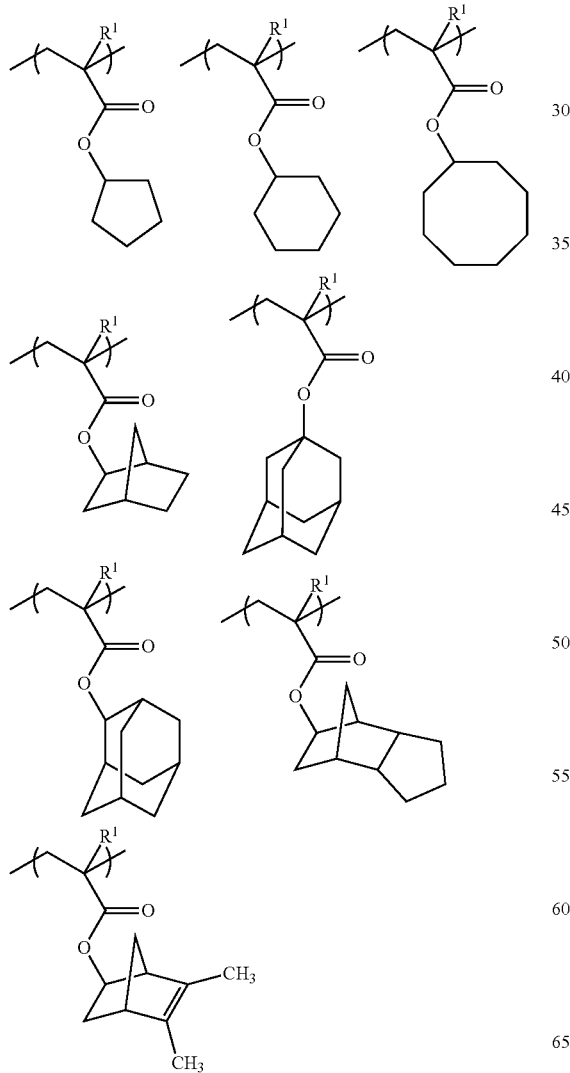

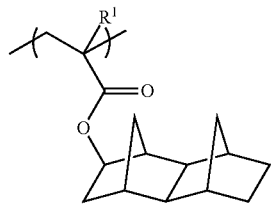

wherein $R^1$ is the same as defined for the formula (2).

Examples of the structural unit (II) that includes an alicyclic hydrocarbon group including a polar group include structural units respectively represented by the following formulas, and the like.

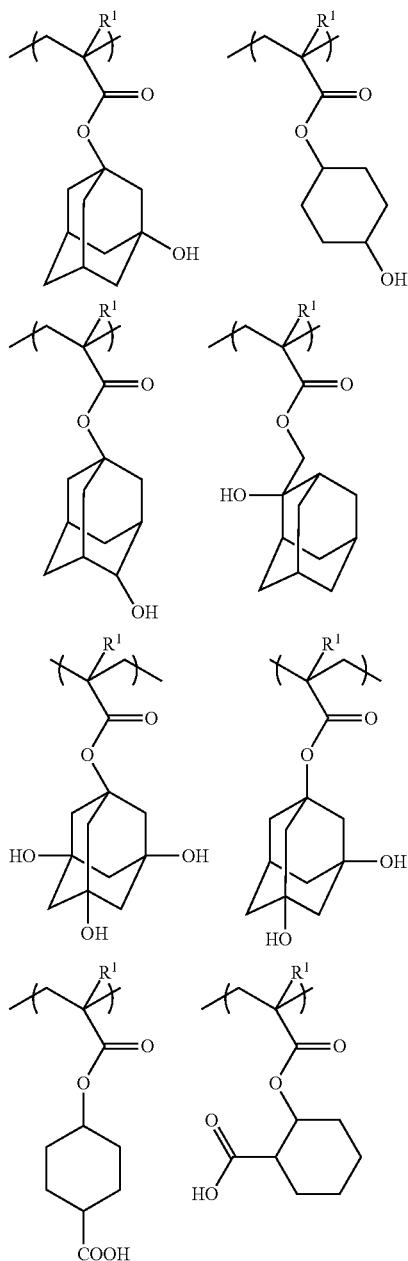

-continued

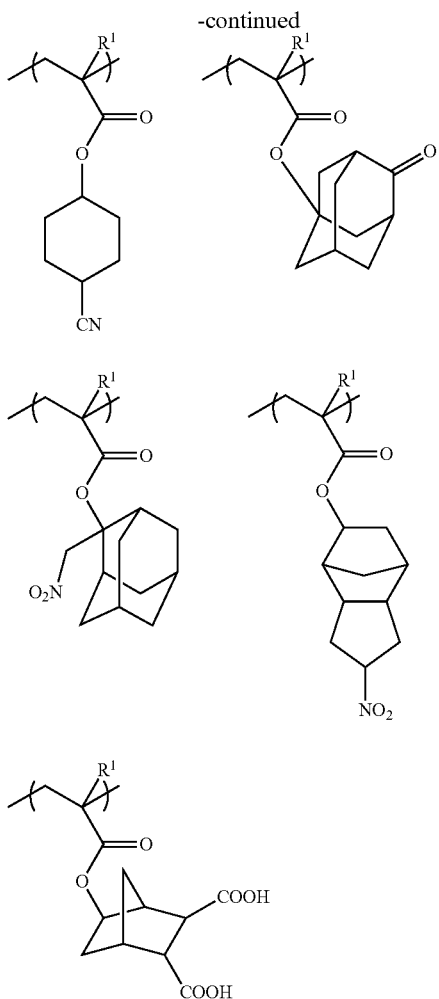

wherein $R^1$ is the same as defined for the formula (2).

The structural unit (II) is preferably a structural unit that includes an unsubstituted monovalent alicyclic hydrocarbon group, more preferably a structural unit that includes a monovalent monoalicyclic hydrocarbon group, still more preferably a structural unit derived from a cycloalkyl(meth) acrylate, and particularly preferably a structural unit derived from cyclohexyl(meth)acrylate, from the viewpoint of adjusting the properties of the polymer [B].

The content of the structural unit (II) in the polymer [B] is preferably 0 to 95 mol %, more preferably 10 to 90 mol %, still more preferably 20 to 85 mol %, and particularly preferably 50 to 85 mol %, based on the total structural units included in the polymer [B]. When the content of the structural unit (II) is within the above range, it is possible to more appropriately adjust the properties (e.g., polarity and solubility in a developer) of the polymer [B], and improve the EL performance, the MEEF performance, and the resolution of the resist pattern formed using the resist pattern-forming method. If the content of the structural unit (II) exceeds 95 mol %, the sensitivity of the photoresist composition (I) may decrease.

Structural Unit (III)

The structural unit (III) is a structural unit that includes at least one structure selected from the group consisting of a lactone structure, a cyclic carbonate structure, and a sultone structure. When the polymer [B] further includes the structural unit (III), it is possible to adjust the properties (e.g., solubility in a developer) of the polymer [B], and improve the EL performance, the MEEF performance, and the resolution of the resist pattern formed using the resist pattern-forming method. It is also possible to improve adhesion between the resist film and the substrate. The term "lactone structure" used herein refers to a structure that includes one ring (lactone ring) that includes a linkage represented by —O—C(O)—. The term "cyclic carbonate structure" used herein refers to a structure that includes one ring (cyclic carbonate ring) that includes a linkage represented by —O—C(O)—O—. The term "sultone structure" used herein refers to a structure that includes one ring (sultone ring) that includes a linkage represented by —O—S(O)$_2$—.

Examples of the structural unit that includes a lactone structure include structural units respectively represented by the following formulas, and the like.

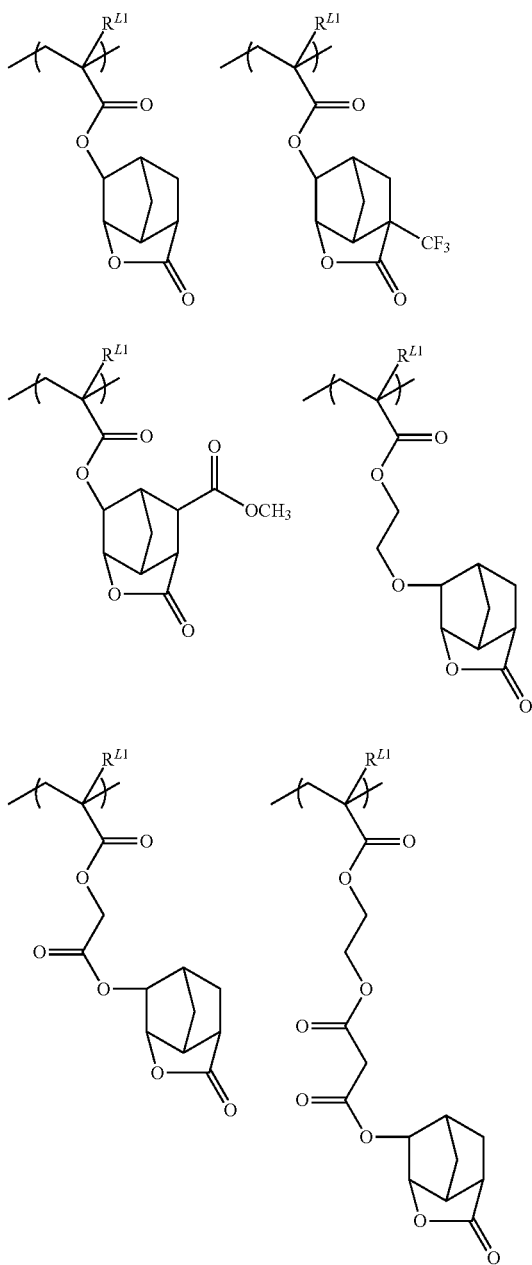

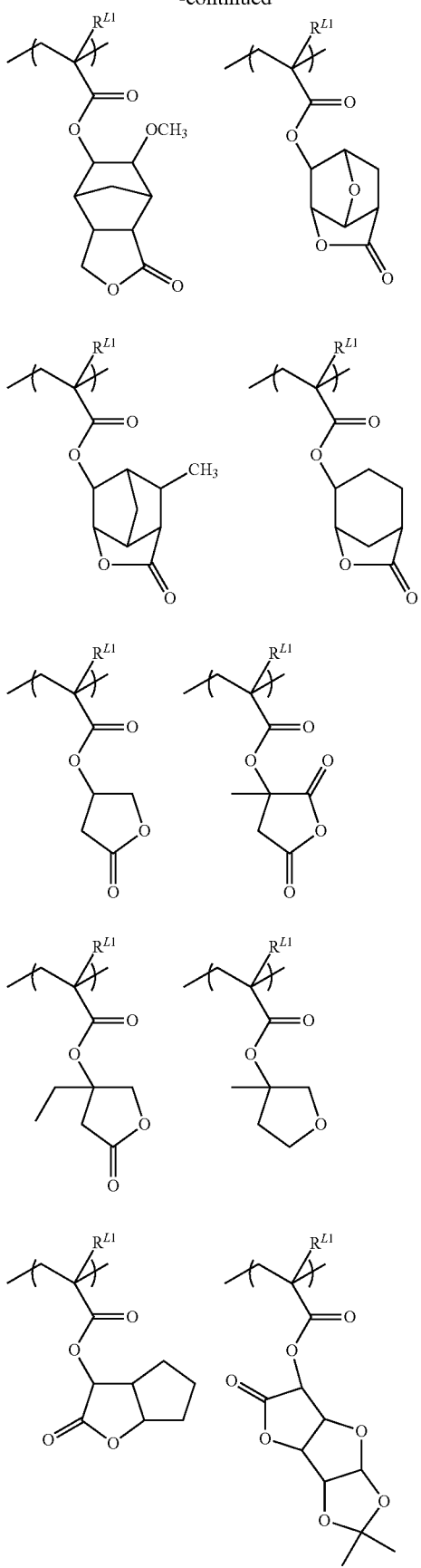

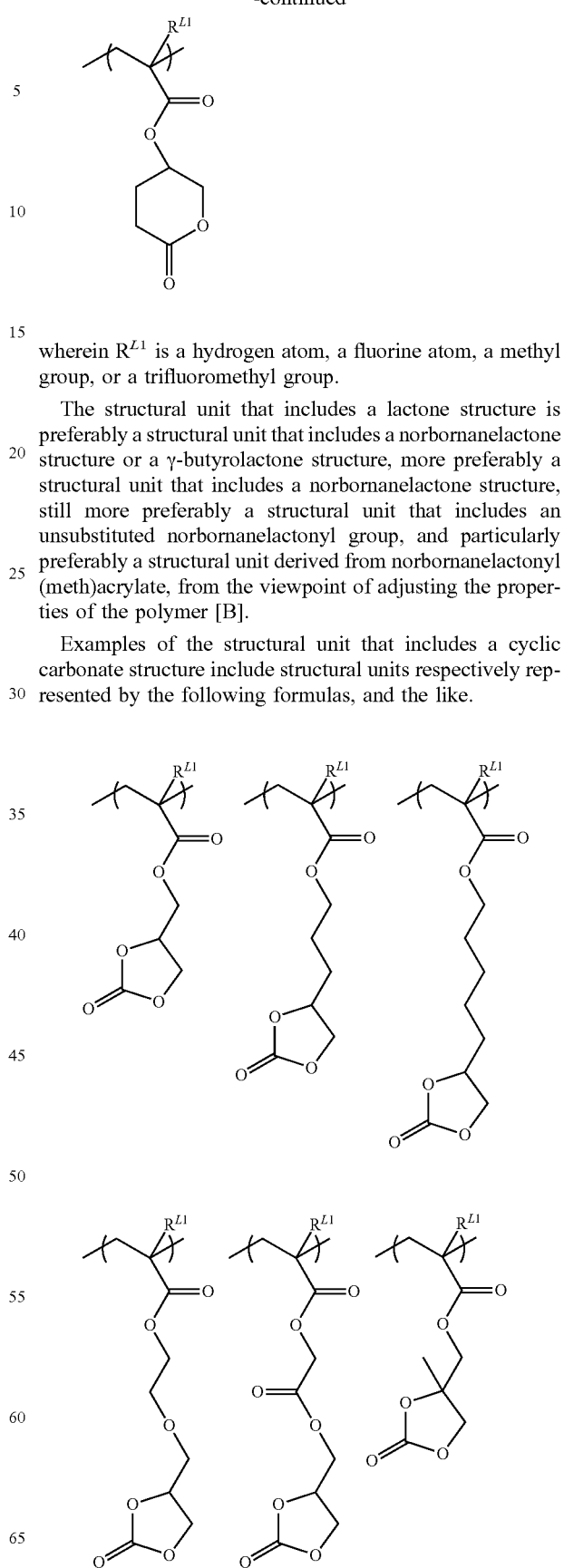

wherein $R^{L1}$ is a hydrogen atom, a fluorine atom, a methyl group, or a trifluoromethyl group.

The structural unit that includes a lactone structure is preferably a structural unit that includes a norbornanelactone structure or a γ-butyrolactone structure, more preferably a structural unit that includes a norbornanelactone structure, still more preferably a structural unit that includes an unsubstituted norbornanelactonyl group, and particularly preferably a structural unit derived from norbornanelactonyl (meth)acrylate, from the viewpoint of adjusting the properties of the polymer [B].

Examples of the structural unit that includes a cyclic carbonate structure include structural units respectively represented by the following formulas, and the like.

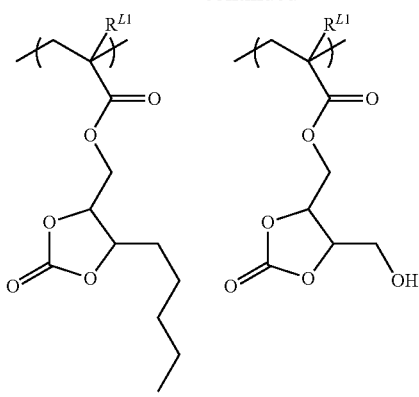
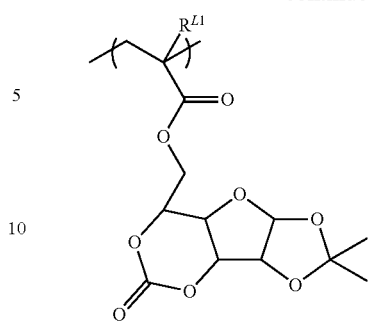
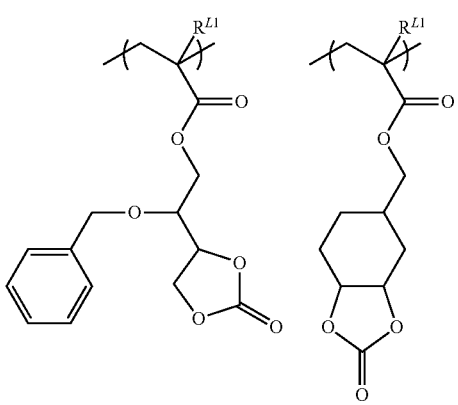
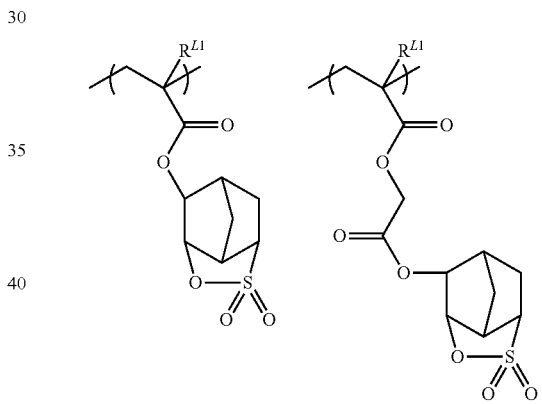

wherein $R^{L1}$ is a hydrogen atom, a fluorine atom, a methyl group, or a trifluoromethyl group.

The structural unit that includes a cyclic carbonate structure is preferably a structural unit that includes an ethylenecarbonate ring structure, more preferably a structural unit that includes an unsubstituted ethylene carbonate group, and still more preferably a structural unit derived from ethylenecarbonatomethyl(meth)acrylate, from the viewpoint of adjusting the properties of the polymer [B].

Examples of the structural unit that includes a sultone structure include structural units respectively represented by the following formulas, and the like.

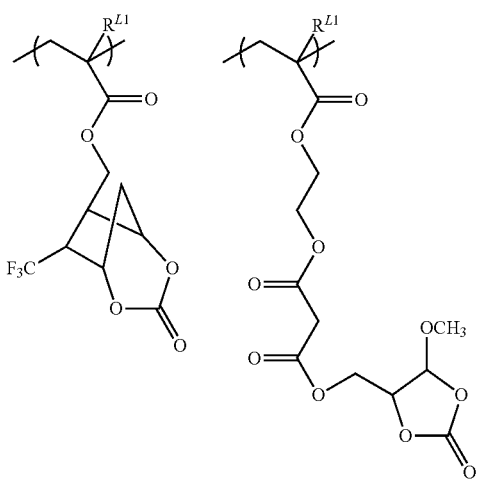
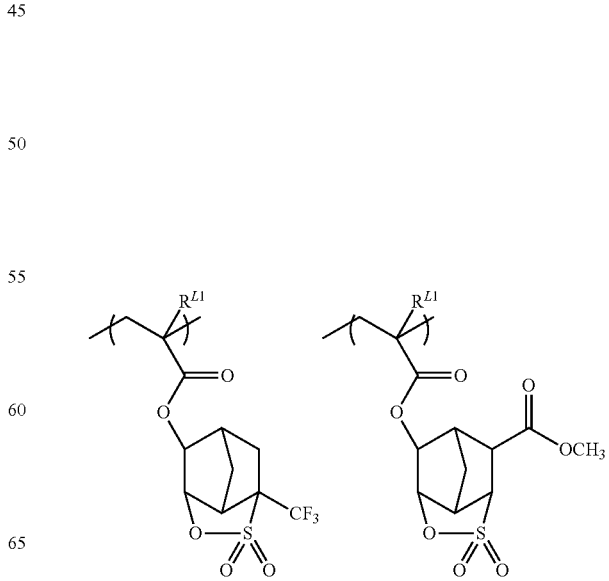
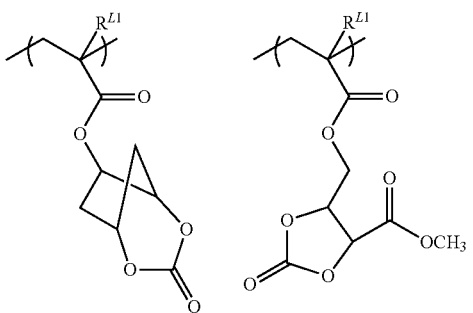

-continued

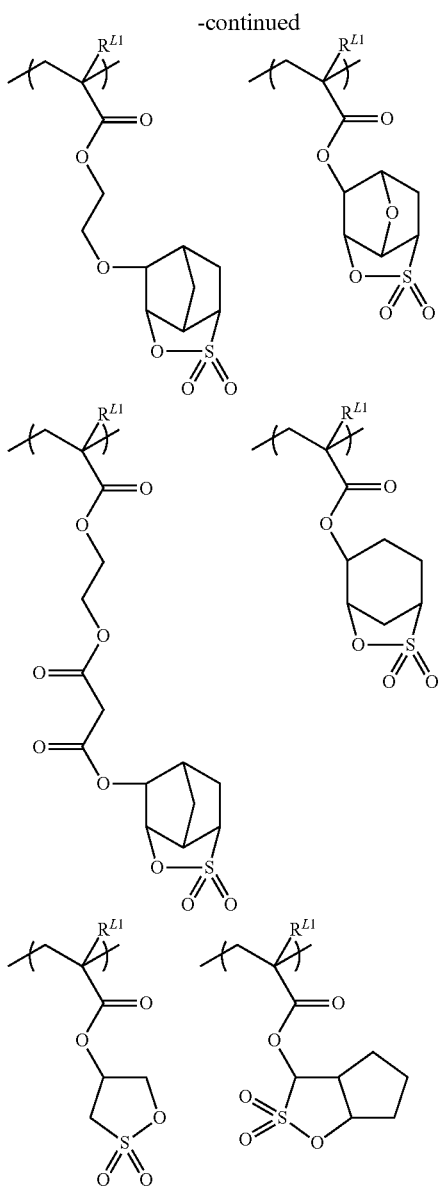

wherein $R^{L1}$ is a hydrogen atom, a fluorine atom, a methyl group, or a trifluoromethyl group.

The structural unit that includes a sultone structure is preferably a structural unit that includes a norbornanesultone structure, more preferably a structural unit that includes an unsubstituted norbornanesultonyl group, and still more preferably a structural unit derived from norbornanesultonyl (meth)acrylate, from the viewpoint of adjusting the properties of the polymer [B].

The structural unit (III) is preferably a structural unit that includes a lactone structure or a structural unit that includes a cyclic carbonate structure, and more preferably a structural unit that includes a cyclic carbonate structure, from the viewpoint of adjusting the properties of the polymer [B].

The content of the structural unit (III) in the polymer [B] is preferably 0 to 80 mol %, more preferably 5 to 50 mol %, and still more preferably 10 to 35 mol %, based on the total structural units included in the polymer [B]. When the content of the structural unit (III) is within the above range, it is possible to more appropriately adjust the properties (e.g., polarity and solubility in a developer) of the polymer [B], and improve the EL performance, the MEEF performance, and the resolution of the resist pattern formed using the resist pattern-forming method. If the content of the structural unit (III) exceeds 80 mol %, the sensitivity of the photoresist composition (I) may decrease.

The polymer [B] may further include an additional structural unit other than the structural units (I) to (III). The content of the additional structural unit in the polymer [B] is normally 30 mass % or less, and preferably 20 mass % or less, based on the total structural units included in the polymer [B].

The total content of the structural unit (I) and the structural unit (II) in the polymer [B] is preferably 75 mol % or more, more preferably 85 mol % or more, still more preferably 95 mol % or more, and particularly preferably 99 mol % or more, based on the total structural units included in the polymer [B], from the viewpoint of improving the EL performance of the photoresist composition (I).

The total content of the structural unit (I), the structural unit (II), and the structural unit (III) in the polymer [B] is preferably 80 mol % or more, more preferably 90 mol % or more, still more preferably 95 mol % or more, and particularly preferably 99 mol % or more, based on the total structural units included in the polymer [B], from the viewpoint of improving the EL performance, the MEEF performance, and the resolution of the photoresist composition (I).

The polymer [B] substantially does not include a structural unit including an acid-labile group. The term "acid-labile group" used herein refers to a group that substitutes the hydrogen atom of a carboxyl group, a hydroxyl group, or the like, and dissociates due to the effect of an acid. The expression "the polymer [B] substantially does not include a structural unit including an acid-labile group" means that the content of a structural unit including an acid-labile group in the polymer [B] is preferably 10 mol % or less, more preferably 5 mol % or less, still more preferably 3 mol % or less, and particularly preferably 1 mol % or less, based on the total structural units included in the polymer [B]. When the polymer [B] included in the photoresist composition (I) includes the structural unit (I), and substantially does not include a structural unit including an acid-labile group, it is possible to improve the dissolution contrast, and improve the EL performance, the MEEF performance, and the resolution of the photoresist composition (I).

Examples of the structural unit including an acid-labile group include a structural unit represented by the following formula, and the like.

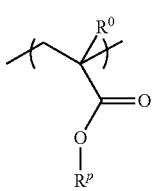

(0)

wherein $R^0$ is a hydrogen atom, a fluorine atom, a methyl group, or a trifluoromethyl group, and $R^p$ is an acid-labile group represented by the following formula (0-i).

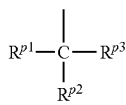

(0-i)

wherein $R^{p1}$, $R^{p2}$, and $R^{p3}$ are independently an alkyl group having 1 to 4 carbon atoms or a monovalent alicyclic hydrocarbon group having 3 to 20 carbon atoms, provided that $R^{p2}$ and $R^{p3}$ optionally bond to each other to form a divalent alicyclic hydrocarbon group having 3 to 20 carbon atoms together with the carbon atom to which $R^{p2}$ and $R^{p3}$ are bonded.

Method for Synthesizing Polymer [B]

The polymer [B] may be synthesized by polymerizing a monomer that produces each structural unit in an appropriate solvent using a radical initiator, for example.

Examples of the radical initiator include azo-based radical initiators such as azobisisobutyronitrile (AIBN), 2,2'-azobis (4-methoxy-2,4-dimethylvaleronitrile), 2,2'-azobis(2-cyclopropylpropionitrile), 2,2'-azobis(2,4-dimethylvaleronitrile), and dimethyl 2,2'-azobisisobutyrate; peroxide-based radical initiators such as benzoyl peroxide, t-butyl hydroperoxide, and cumene hydroperoxide; and the like. Among these, AIBN and dimethyl 2,2'-azobisisobutyrate are preferable, and AIBN is more preferable. These radical initiators may be used either alone or in combination.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, methyl ethyl ketone, 4-methyl-2-pentanone, and 2-heptanone; ethers such as tetrahydrofuran, dimethoxyethane, and diethoxyethane; alcohols such as methanol, ethanol, 1-propanol, 2-propanol, and 4-methyl-2-pentanol; and the like. These solvents may be used either alone or in combination.

The reaction (polymerization) temperature is normally 40 to 150° C., and preferably 50 to 120° C. The reaction (polymerization) time is normally 1 to 48 hours, and preferably 1 to 24 hours.

The polystyrene-reduced weight average molecular weight (Mw) of the polymer [B] determined by gel permeation chromatography (GPC) is not particularly limited, but is preferably 1000 to 500,000, more preferably 3000 to 100,000, still more preferably 5000 to 30,000, and particularly preferably 8000 to 20,000. If the Mw of the polymer [B] is less than 1000, the heat resistance of the resulting resist film may deteriorate. If the Mw of the polymer [B] exceeds 500,000, the developability of the resulting resist film may deteriorate. The number average molecular weight (Mn) of the polymer [B]determined by vapor pressure osmometry (VPO) is preferably 1000 to 300,000, more preferably 2000 to 70,000, still more preferably 3000 to 20,000, and particularly preferably 5000 to 15,000. If the Mn of the polymer [B] is less than 1000, the heat resistance of the resulting resist film may deteriorate. If the Mn of the polymer [B] exceeds 300,000, the developability of the resulting resist film may deteriorate.

The ratio (Mw/Mn) of the Mw to the polystyrene-reduced number average molecular weight (Mn) of the polymer [B] determined by GPC is normally 1 to 5, preferably 1 to 3, and more preferably 1 to 2.

Fluorine Atom-Containing Polymer [C]

The photoresist composition (I) may include the fluorine atom-containing polymer [C] (excluding a polymer that falls under the polymer [B]). When the photoresist composition (I) includes the fluorine atom-containing polymer [C], the fluorine atom-containing polymer [C] tends to be distributed in the surface layer of the resist film due to the oil repellency of the fluorine atom-containing polymer [C], and elution of the acid generator, an acid diffusion controller, and the like from the resist film into an immersion medium during liquid immersion lithography can be suppressed. It is also possible to control the advancing contact angle formed by the resist film and the immersion medium within the desired range due to the water repellency of the fluorine atom-containing polymer [C], and suppress occurrence of bubble defects. Moreover, since the receding contact angle formed by the resist film and the immersion medium can be increased, it is possible to implement high-speed scan exposure so that water droplets do not remain. A resist film suitable for liquid immersion lithography can be formed by incorporating the fluorine atom-containing polymer [C] in the photoresist composition (I).

The fluorine atom-containing polymer [C] is not particularly limited as long as the fluorine atom-containing polymer [C] is a polymer that includes a fluorine atom. The fluorine atom-containing polymer [C] may normally be produced by polymerizing one or more monomers that include a fluorine atom in the structure. Examples of the monomer that includes a fluorine atom in the structure include monomers that include a fluorine atom in the main chain, monomers that include a fluorine atom in the side chain, monomers that include a fluorine atom in the main chain and the side chain, and the like.

Examples of the monomers that include a fluorine atom in the main chain include α-fluoroacrylate compounds, α-trifluoromethyl acrylate compound, β-fluoroacrylate compounds, β-trifluoromethyl acrylate compounds, α,β-fluoroacrylate compounds, α,β-trifluoromethyl acrylate compounds, compounds in which a hydrogen atom in at least one vinyl site is substituted with a fluorine atom, a trifluoromethyl group, or the like, and the like.

Examples of the monomers that include a fluorine atom in the side chain include alicyclic olefin compounds (e.g., norbornene) in which the side chain is substituted with a fluorine atom, a fluoroalkyl group, or a derivative thereof, ester compounds produced by reacting acrylic acid or methacrylic acid with a fluoroalkyl alcohol or a derivative thereof, olefins in which the side chain (i.e., a site that does not include a double bond) is substituted with a fluorine atom, a fluoroalkyl group, or a derivative thereof, and the like.

Examples of the monomers that include a fluorine atom in the main chain and the side chain include ester compounds formed by a fluoroalkyl alcohol or a derivative thereof and α-fluoroacrylic acid, β-fluoroacrylic acid, α,β-fluoroacrylic acid, α-trifluoromethylacrylic acid, β-trifluoromethylacrylic acid, or α,β-trifluoromethylacrylic acid, compounds obtained by substituting the side chain of a compound, in which at least one vinyl site is substituted with a fluorine atom, a trifluoromethyl group, or the like, with a fluorine atom, a fluoroalkyl group, or a derivative thereof, compounds obtained by substituting the hydrogen atom of an alicyclic olefin compound that is bonded to the double bond with a fluorine atom, a trifluoromethyl group, or the like, and substituting the side chain thereof with a fluoroalkyl group or a derivative thereof, and the like. Note that the term "alicyclic olefin compound" used herein refers to a compound that includes a double bond in its ring structure.

A structural unit included in the fluorine atom-containing polymer [C] that includes a fluorine atom is not particularly limited, but is preferably a structural unit represented by the following formula (C1) (hereinafter may be referred to as "structural unit (C-I)").

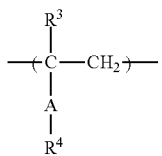

(C1)

wherein $R^3$ is a hydrogen atom, a fluorine atom, a methyl group, or a trifluoromethyl group, A is a single bond or a divalent linking group, and $R^4$ is a linear or branched alkyl group having 1 to 6 carbon atoms that includes at least one fluorine atom, a monovalent alicyclic hydrocarbon group having 4 to 20 carbon atoms that includes at least one fluorine atom, or a derivative thereof.

Examples of the divalent linking group represented by A include —O—, —S—, —COO—, —CONH—, —SO$_2$NH—, —OCONH—, and the like. Among these, —COO— is preferable.

Examples of the linear or branched alkyl group having 1 to 6 carbon atoms represented by $R^4$ that includes at least one fluorine atom, include a fluoromethyl group, a difluoromethyl group, a perfluoromethyl group, a 2,2,2-trifluoroethyl group, a perfluoroethyl group, a perfluoro-n-propyl group, a perfluoro-1-propyl group, a 1,1,1,3,3,3-hexafluoro-2-propyl group, a perfluoro-n-butyl group, and the like. Among these, a 2,2,2-trifluoroethyl group and a 1,1,1,3,3,3-hexafluoro-2-propyl group are preferable.

Examples of the monovalent alicyclic hydrocarbon group having 4 to 20 carbon atoms represented by $R^4$ that includes at least one fluorine atom, include a fluorocyclobutyl group, a fluorocyclopentyl group, a difluorocyclohexyl group, a difluoronorbornyl group, a perfluoroadamantyl group, and the like.

Examples of the derivative represented by $R^4$ include a 2-hydroxy-1,1,1,3,3,3-trifluoro-2-propyl group, a 2-hydroxy-2-trifluoromethyl-1,1,1-trifluoro-2-pentyl group, a 2-hydroxy-2-trifluoromethyl-3-methyl-1,1,1-trifluoro-4-butyl group, a 2-hydroxy-2-trifluoromethyl-6-methyl-4-heptyl group, and the like. Among these, a 2-hydroxy-2-trifluoromethyl-1,1,1-trifluoro-2-pentyl group, a 2-hydroxy-2-trifluoromethyl-3-methyl-1,1,1-trifluoro-4-butyl group, and a 2-hydroxy-2-trifluoromethyl-6-methyl-4-heptyl group are preferable.

Examples of a monomer that produces the structural unit (C-I) include trifluoromethyl(meth)acrylate, 2,2,2-trifluoroethyl(meth)acrylate, perfluoroethyl(meth)acrylate, perfluoro-n-propyl(meth)acrylate, perfluoro-1-propyl(meth)acrylate, perfluoro-n-butyl(meth)acrylate, perfluoro-1-butyl(meth)acrylate, perfluoro-t-butyl(meth)acrylate, 2-(1,1,1,3,3,3-hexafluoropropyl)(meth)acrylate, 1-(2,2,3,3,4,4,5,5-octafluoropentyl)(meth)acrylate, perfluorocyclohexylmethyl(meth)acrylate, 1-(2,2,3,3,3-pentafluoropropyl)(meth)acrylate, 1-(3,3,4,4,5,5,6,6,7,7,8,8,9,9,10,10,10-heptadecafluorodecyl)(meth)acrylate, 1-(5-trifluoromethyl-3,3,4,4,5,6,6,6-octafluorohexyl)(meth)acrylate, 2-hydroxy-2-trifluoromethyl-1,1,1-trifluoro-2-pentyl(meth)acrylate, 2-hydroxy-2-trifluoromethyl-3-methyl-1,1,1-trifluoro-4-butyl(meth)acrylate, 2-hydroxy-2-trifluoromethyl-6-methyl-4-heptyl(meth)acrylate, and the like. Among these, 2,2,2-trifluoroethyl(meth)acrylate, 2-(1,1,1,3,3,3-hexafluoropropyl)(meth)acrylate, 2-hydroxy-2-trifluoromethyl-1,1,1-trifluoro-2-pentyl(meth)acrylate, 2-hydroxy-2-trifluoromethyl-3-methyl-1,1,1-trifluoro-4-butyl(meth)acrylate, and 2-hydroxy-2-trifluoromethyl-6-methyl-4-heptyl(meth)acrylate are preferable.

The content of the structural unit (C-I) in the fluorine atom-containing polymer [C] is preferably 5 mol % or more, more preferably 10 mol % or more, and still more preferably 20 mol % or more, based on the total structural units included in the fluorine atom-containing polymer [C]. If the content of the structural unit (C-I) is less than 5 mol %, a receding contact angle equal to or more than 70° may not be achieved, or elution of the acid generator and the like from the resist film may not be sufficiently suppressed. The fluorine atom-containing polymer [C] may include only one type of the structural unit (C-I), or may include two or more types of the structural unit (C-I).

The fluorine atom-containing polymer [C] may also include one or more additional structural units (e.g., a structural unit that includes an acid-labile group and controls the solubility of the fluorine atom-containing polymer [C] in the developer, a structural unit that includes a lactone structure, a cyclic carbonate structure, or a sultone structure, or the like, a structural unit that includes a non-acid-labile chain-like hydrocarbon group or alicyclic hydrocarbon group, or a structural unit that includes an aromatic hydrocarbon group and suppresses scattering of light due to reflection from the substrate) other than the structural unit (C-I).

Examples of the structural unit that includes an acid-labile group include a structural unit represented by the following formula (C2) (hereinafter may be referred to as "structural unit (C-II)"), and the like.

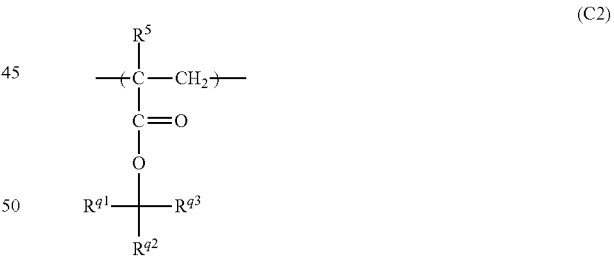

(C2)

wherein $R^5$ is a hydrogen atom, a fluorine atom, a methyl group, or a trifluoromethyl group, and $R^{q1}$, $R^{q2}$, and $R^{q3}$ are independently a linear or branched alkyl group having 1 to 4 carbon atoms, a monovalent alicyclic hydrocarbon group having 4 to 20 carbon atoms, or a derivative thereof, provided that $R^{q2}$ and $R^{q3}$ optionally bond to each other to form a divalent alicyclic hydrocarbon group having 4 to 20 carbon atoms together with the carbon atom to which $R^{q2}$ and $R^{q3}$ are bonded.

Examples of the linear or branched alkyl group having 1 to 4 carbon atoms represented by $R^{q1}$, $R^{q2}$, and $R^{q3}$ include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 20 carbon atoms represented by $R^{q1}$, $R^{q2}$, and $R^{q3}$ include groups obtained by removing one hydrogen atom from a cycloalkane (e.g., norbornane, tricyclodecane, tetracyclododecane, adamantane, cyclobutane, cyclopentane, cyclohexane, cycloheptane, or cyclooctane), and the like.

Examples of the divalent alicyclic hydrocarbon group having 4 to 20 carbon atoms formed by $R^{q2}$ and $R^{q3}$ include groups obtained by removing one hydrogen atom from the monovalent alicyclic hydrocarbon groups mentioned above in connection with $R^{q1}$, $R^{q2}$, and $R^{q3}$, and the like.

Examples of the acid-labile group (i.e., the group that is bonded to the oxygen atom of the ester group) in the formula (C2) include a t-butyl group, a 1-n-(1-ethyl-1-methyl)propyl group, a 1-n-(1,1-dimethyl)propyl group, a 1-n-(1,1-dimethyl)butyl group, a 1-n-(1,1-dimethyl)pentyl group, 1-(1,1-diethyl)propyl group, a 1-n-(1,1-diethyl)butyl group, a 1-n-(1,1-diethyl)pentyl group, a 1-(1-methyl)cyclopentyl group, a 1-(1-ethyl)cyclopentyl group, a 1-(1-n-propyl)cyclopentyl group, a 1-(1-i-propyl)cyclopentyl group, a 1-(1-methyl)cyclohexyl group, a 1-(1-ethyl)cyclohexyl group, a 1-(1-n-propyl)cyclohexyl group, a 1-(1-i-propyl)cyclohexyl group, a 1-{1-methyl-1-(2-norbornyl)}ethyl group, a 1-{1-methyl-1-(2-tetracyclodecanyl)}ethyl group, a 1-{1-methyl-1-(1-adamantyl)}ethyl group, a 2-(2-methyl)norbornyl group, a 2-(2-ethyl)norbornyl group, a 2-(2-n-propyl)norbornyl group, a 2-(2-i-propyl)norbornyl group, a 2-(2-methyl)tetracyclodecanyl group, a 2-(2-ethyl)tetracyclodecanyl group, a 2-(2-n-propyl)tetracyclodecanyl group, a 2-(2-i-propyl)tetracyclodecanyl group, a 1-(1-methyl)adamantyl group, a 1-(1-ethyl)adamantyl group, a 1-(1-n-propyl)adamantyl group, a 1-(1-i-propyl)adamantyl group, a group obtained by substituting the hydrogen atom bonded to such an alicyclic ring with at least one linear or branched alkyl group having 1 to 4 carbon atoms or at least one cyclic alkyl group having 3 to 10 carbon atoms, and the like.

Examples of a monomer that produces the structural unit (C-II) include 2-methyladamant-2-yl(meth)acrylate, 2-methyl-3-hydroxyadamant-2-yl(meth)acrylate, 2-ethyladamant-2-yl(meth)acrylate, 2-ethyl-3-hydroxyadamant-2-yl(meth)acrylate, 2-n-propyladamant-2-yl(meth)acrylate, 2-isopropyladamant-2-yl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]decan-8-yl(meth)acrylate, 8-ethyltricyclo[5.2.1.0$^{2,6}$]decan-8-yl(meth)acrylate, 4-methyltetracyclo[6.2.1$^{3,6}$.0$^{2,7}$]dodecan-4-yl(meth)acrylate, 4-ethyltetracyclo[6.2.1$^{3,6}$.0$^{2,7}$]dodecan-4-yl(meth)acrylate, 1-(bicyclo[2.2.1]hept-2-yl)-1-methylethyl(meth)acrylate, 1-(tricyclo[5.2.1.0$^{2,6}$]decan-8-yl)-1-methylethyl(meth)acrylate, 1-(tetracyclo[6.2.1$^{3,6}$.0$^{2,7}$]dodecan-4-yl)-1-methylethyl(meth)acrylate, 1-(adamantan-1-yl)-1-methylethyl(meth)acrylate, 1-(3-hydroxyadamantan-1-yl)-1-methylethyl(meth)acrylate, 1,1-dicyclohexylethyl(meth)acrylate, 1,1-di(bicyclo[2.2.1]hept-2-yl)ethyl(meth)acrylate, 1,1-di(tricyclo[5.2.1.0$^{2,6}$]decan-8-yl)ethyl(meth)acrylate, 1,1-di(tetracyclo[6.2.1$^{3,6}$.0$^{2,7}$]dodecan-4-yl)ethyl(meth)acrylate, 1,1-di(adamantan-1-yl)ethyl(meth)acrylate, 1-methyl-1-cyclopentyl(meth)acrylate, 1-ethyl-1-cyclopentyl(meth)acrylate, 1-methyl-1-cyclohexyl(meth)acrylate, 1-ethyl-1-cyclohexyl(meth)acrylate, and the like.

Among these, a structural unit derived from a 1-alkyl-1-cycloalkyl(meth)acrylate is preferable, a structural unit derived from a 1-alkyl-1-cyclopentyl(meth)acrylate is more preferable, and a structural unit derived from 1-ethyl-1-cyclopentyl(meth)acrylate is still more preferable.

Examples of the structural unit that includes a lactone structure, a cyclic carbonate structure, or a sultone structure (hereinafter may be referred to as "structural unit (C-III)") include those mentioned above in connection with the structural unit (III) that may be included in the polymer [B].

Examples of the structural unit that includes a non-acid-labile chain-like hydrocarbon group or alicyclic hydrocarbon group (hereinafter may be referred to as "structural unit (C-IV)") include a structural unit represented by the following formula (C4), and the like.

(C4)

wherein $R^6$ is a hydrogen atom, a fluorine atom, a methyl group, or a trifluoromethyl group, and $R^7$ is a non-acid-labile monovalent chain-like hydrocarbon group having 1 to 20 carbon atoms or a non-acid-labile monovalent alicyclic hydrocarbon group having 4 to 20 carbon atoms, provided that some or all of the hydrogen atoms of the chain-like hydrocarbon group and the alicyclic hydrocarbon group are optionally substituted with a substituent.

Examples of the monovalent chain-like hydrocarbon group having 1 to 20 carbon atoms represented by $R^7$ include a methyl group, an ethyl group, an n-propyl group, an i-propyl group, an n-butyl group, an n-hexyl group, an n-octyl group, a 2-ethylhexyl group, and the like. Among these, a 2-ethylhexyl group is preferable.

Examples of the monovalent alicyclic hydrocarbon group having 4 to 20 carbon atoms represented by $R^7$ include a group obtained by removing one hydrogen atom from a cycloalkane (e.g., cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, or tricyclo[3.3.1.1$^{3,7}$]decane), and the like.

Examples of a substituent that may substitute the chain-like hydrocarbon group and the alicyclic hydrocarbon group include a hydroxyl group, a cyano group, a hydroxyalkyl group having 1 to 10 carbon atoms, a carboxyl group, and the like. Further examples of the substituent include an oxygen atom that substitutes two hydrogen atoms bonded to one carbon atom of the alicyclic hydrocarbon group to form a carbonyl group.

Examples of a monomer that produces the structural unit (C-IV) include 2-ethylhexyl(meth)acrylate, bicyclo[2.2.1]hept-2-yl(meth)acrylate, bicyclo[2.2.2]oct-2-yl(meth)acrylate, tricyclo[5.2.1.0$^{2,6}$]dec-7-yl(meth)acrylate, tetracyclo[6.2.1.1$^{3,6}$.0$^{2,7}$]dodec-9-yl(meth)acrylate, tricyclo[3.3.1.1$^{3,7}$]dec-1-yl(meth)acrylate, tricyclo[3.3.1.1$^{3,7}$]dec-2-yl(meth)acrylate, and the like. Among these, (meth)acrylates including a chain-like hydrocarbon group are preferable, and 2-ethylhexyl(meth)acrylate is more preferable.

Examples of a monomer that produces the structural unit that includes an aromatic hydrocarbon group (hereinafter may be referred to as "structural unit (C-V)") include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methyl styrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methyl styrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl(meth)acrylate, benzyl(meth)acrylate, 4-t-butylphenyl(meth)acrylate, acenaphthylene, 5-hydroxyacenaphthylene, 1-vinylnaphthalene, 2-vinylnaphthalene, 2-hydroxy-6-vinylnaphthalene, 1-naphthyl(meth)acrylate, 2-naphthyl(meth)acrylate, 1-naphthylmethyl(meth)acrylate, 1-anthryl(meth)acrylate, 2-anthryl(meth)acrylate, 9-anthryl(meth)acrylate, 9-anthrylmethyl(meth)acrylate, 1-vinylpyrene, and the like. Among these, 4-t-butylphenyl(meth)acrylate is preferable.

The fluorine atom-containing polymer [C] may include only one type of the structural unit (C-II), or may include two or more types of the structural unit (C-II) as the additional structural unit. The fluorine atom-containing polymer [C] may include only one type of the structural unit (C-III), or may include two or more types of the structural unit (C-III) as the additional structural unit. The fluorine atom-containing polymer [C] may include only one type of the structural unit (C-IV), or may include two or more types of the structural unit (C-IV) as the additional structural unit. The fluorine atom-containing polymer [C] may include only one type of the structural unit (C-V), or may include two or more types of the structural unit (C-V) as the additional structural unit. The content of the additional structural unit in the fluorine atom-containing polymer [C] is normally 80 mol % or less, preferably 75 mol % or less, and more preferably 70 mol % or less, based on the total structural units included in the fluorine atom-containing polymer [C].

Method for Synthesizing Fluorine Atom-Containing Polymer [C]

The fluorine atom-containing polymer [C] may be synthesized by polymerizing a monomer that produces each structural unit in an appropriate solvent using a radical initiator, for example. The fluorine atom-containing polymer [C] may be synthesized in the same manner as the polymer [B].

The Mw of the fluorine atom-containing polymer [C] is preferably 1000 to 100,000, more preferably 2000 to 50,000, still more preferably 3000 to 30,000, and particularly preferably 4000 to 10,000. When the Mw of the fluorine atom-containing polymer [C] is within the above range, a higher receding contact angle can be achieved, and elution of the acid generator and the like from the resist film can be efficiently suppressed. The ratio (Mw/Mn) of the Mw to the Mn of the fluorine atom-containing polymer [C] is normally 1 to 3, preferably 1 to 2.5, and more preferably 1 to 2.

Solvent [D]

The photoresist composition (I) normally includes the solvent [D]. The solvent [D] is not particularly limited as long as the solvent [D] can dissolve or disperse the acid generator [A], the polymer [B], the optional fluorine atom-containing polymer [C], and the like.

Examples of the solvent [D] include alcohol-based solvents, ether-based solvents, ketone-based organic solvents, amide-based solvents, ester-based organic solvents, hydrocarbon-based solvents, and the like.

Examples of the alcohol-based solvents include monohydric alcohol-based solvents such as methanol, ethanol, n-propanol, isopropanol, n-butanol, isobutanol, sec-butanol, tert-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohol-based solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether-based solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether-based solvents include dialkyl ether-based solvents such as diethyl ether, dipropyl ether, and dibutyl ether; alkyl aryl ether-based solvents such as anisole (methyl phenyl ether) and ethyl phenyl ether; diaryl ether-based solvents such as diphenyl ether; and the like.

Examples of the ketone-based solvents include chain-like ketone-based solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, and trimethylnonane; cyclic ketone-based solvents such as cyclopentanone, cyclohexanone, cycloheptanone, cyclooctanone, and methylcyclohexanone; 2,4-pentanedione; acetonylacetone; acetophenone; and the like.

Examples of the amide-based solvents include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester-based solvents include acetate-based solvents such as methyl acetate, ethyl acetate, n-propyl acetate, isopropyl acetate, n-butyl acetate, isobutyl acetate, sec-butyl acetate, n-pentyl acetate, isopentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, glycol diacetate, and methoxy triglycol acetate; polyhydric alcohol partial ether acetate-based solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, and dipropylene glycol monoethyl ether acetate; ester-based solvents of acids other than acetic acid, such as ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; lactone-based solvents such as γ-butyrolactone and γ-valerolactone; carbonate-based solvents such as diethyl carbonate and propylene carbonate; and the like.

Examples of the hydrocarbon-based solvents include chain-like hydrocarbon-based solvents such as n-pentane, i-pentane, n-hexane, i-hexane, n-heptane, i-heptane, 2,2,4-trimethylpentane, n-octane, and i-octane; alicyclic hydrocarbon-based solvents such as cyclohexane and methylcyclohexane; aromatic hydrocarbon-based solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

Among these, ketone-based solvents and ester-based solvents are preferable, cyclic ketone-based solvents, polyhydric alcohol partial ether acetate-based solvents, and lactone-based solvents are more preferable, and cyclohexanone, γ-butyrolactone, and propylene glycol monomethyl ether acetate are still more preferable. These solvents may be used either alone or in combination.

Additional Component

The photoresist composition (I) may further include an additional optional component such as an acid amplifier, a polar group-containing alicyclic compound, an acid diffusion controller, a surfactant, and a sensitizer, in addition to the components [A] to [D]. The photoresist composition (I) may include only one type of each additional optional component, or may include two or more types of each additional optional component.

Acid Amplifier

The acid amplifier is a component that is stable in the absence of an acid, but is decomposed in the presence of an acid due to a catalytic reaction to produce a protonic acid. Since the decomposition reaction is promoted as the amount of protonic acid produced increases, production of the protonic acid is amplified. When the photoresist composition (I) includes the acid amplifier, a large amount of protonic acid can be produced as compared with the case where the protonic acid is merely generated by the acid generator [A] upon exposure. This makes it possible to form a larger amount of cationic group from the group (a) included in the polymer [B], and improve the dissolution contrast between the exposed area and the unexposed area. As a result, the EL performance, the MEEF performance, and the resolution of the resist pattern formed using the resist pattern-forming method can be improved. The acid amplifier may be included in the photoresist composition (I) as a compound (described below), and/or may be included in a polymer.

It is preferable that the acid dissociation constant (pKa) of the acid is 3 or less, and more preferably 2 or less, in order to induce decomposition of the acid amplifier through the catalytic effect of the acid. When the acid dissociation constant (pKa) of the acid is more than 3, decomposition of the acid amplifier may not occur sufficiently. The acid is preferably an organic sulfonic acid, and more preferably methanesulfonic acid, ethanesulfonic acid, propanesulfonic acid, butanesulfonic acid, pentanesulfonic acid, hexanesulfonic acid, heptanesulfonic acid, octanesulfonic acid, cyclohexanesulfonic acid, camphorsulfonic acid, trifluoromethanesulfonic acid, 2,2,2-trifluoroethanesulfonic acid, benzenesulfonic acid, p-toluenesulfonic acid, p-bromobenzenesulfonic acid, p-nitrobenzenesulfonic acid, 2-thiophenesulfonic acid, 1-naphthalenesulfonic acid, or 2-naphthalenesulfonic acid.

The acid amplifier is preferably a compound in which a sulfonate group represented by the following formula (E) is bonded to a carbon atom included in a carbocyclic skeleton either directly or through a divalent organic group.

$$—OSO_2—R^a \qquad (E)$$

wherein $R^a$ is a monovalent organic group.

Examples of the monovalent organic group represented by $R^a$ include a chain-like organic group, an organic group that includes an alicyclic structure, an organic group that includes an aromatic ring structure, an organic group that includes a heterocyclic structure, and the like.

The chain-like organic group is preferably an organic group having 1 to 12 (more preferably 1 to 8) carbon atoms. Examples of the chain-like organic group include unsubstituted alkyl groups such as a methyl group, an ethyl group, a propyl group, a butyl group, a pentyl group, and a hexyl group; unsubstituted acyl groups such as a formyl group, an acetyl group, a propionyl group, and a butyryl group; unsubstituted alkenyl groups such as a vinyl group and an allyl group; unsubstituted alkenylcarbonyl groups such as a vinylcarbonyl group and an allylcarbonyl group; derivatives thereof; and the like.

Examples of the organic group that includes an alicyclic structure include alicyclic hydrocarbon groups such as a cyclohexyl group, a cyclooctyl group, a bicyclohydrocarbon group, and a tricyclohydrocarbon group; derivatives thereof; and the like.

Examples of the organic group that includes an aromatic ring structure include aryl groups such as a phenyl group and a naphthyl group; aralkyl groups such as a benzyl group, a phenethyl group, and a naphthylmethyl group; derivatives thereof; and the like.

Examples of the organic group that includes a heterocyclic structure include heterocyclic groups derived from heterocyclic compounds such as 5-membered cyclic compounds that include one heteroatom (e.g., furan, pyrrole, benzofuran, indole, and carbazole), fused ring compounds thereof, 5-membered cyclic compound that include two heteroatoms (e.g., oxazole and pyrazole), fused ring compounds thereof, 6-membered cyclic compounds that include one heteroatom (e.g., pyran, pyrone, coumarin, pyridine, quinoline, isoquinoline, and acridine), fused ring compounds thereof, 6-membered cyclic compounds that include two heteroatoms (e.g., pyridazine, pyrimidine, pyrazine, and phthalazine), fused ring compounds thereof, and derivatives thereof, and the like.

Examples of a substituent include halogen atoms such as a fluorine atom, a chlorine atom, a bromine atom, an iodine atom, oxyhydrocarbon groups, amino groups, substituted amino groups, and the like.

Examples of the compound that includes the sulfonate group represented by the formula (E) include compounds respectively represented by the following formulas, and the like.

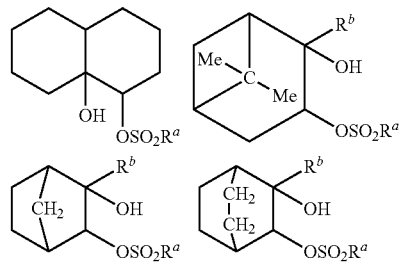

-continued

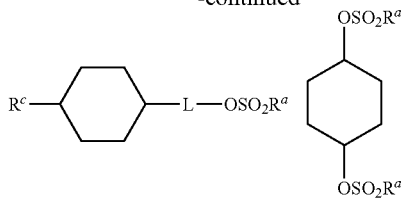

wherein $R^a$ is the same as defined for the formula (E), $R^b$ is a hydrogen atom, a monovalent chain-like organic group, a monovalent organic group that includes an alicyclic structure, or a monovalent organic group that includes an aromatic ring structure, $R^c$ is a monovalent chain-like organic group, a monovalent organic group that includes an alicyclic structure, or a monovalent organic group that includes an aromatic ring structure, and L is a single bond or a divalent organic group.

Examples of the chain-like organic group, the organic group that includes an alicyclic structure, and the organic group that includes an aromatic ring structure represented by $R^b$ and $R^c$ include those mentioned above in connection with $R^a$ included in the formula (E), and the like.

$R^b$ is preferably a chain-like organic group, an organic group that includes an alicyclic structure, or an organic group that includes an aromatic ring structure.

The monovalent chain-like organic group represented by $R^c$ is preferably an alkyl group that is optionally substituted with a fluorine atom, or a cycloalkyl group that is optionally substituted with a fluorine atom. Examples of these groups include a methyl group, an ethyl group, an n-propyl group, an isopropyl group, an n-butyl group, a t-butyl group, an n-pentyl group, a cyclopentyl group, an n-hexyl group, a cyclohexyl group, an n-octyl group, a trifluoromethyl group, a pentafluoroethyl group, a perfluorobutyl group, a perfluoro-t-butyl group, a perfluoropentyl group, a perfluorocyclopentyl group, a perfluorohexyl group, a perfluorocyclohexyl group, a perfluorooctyl group, and the like.

The divalent organic group represented by L is preferably the group represented by the following formula.

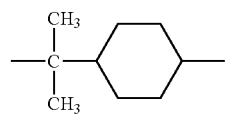

Examples of the acid amplifier include the compounds respectively represented by the following formulas, and the like.

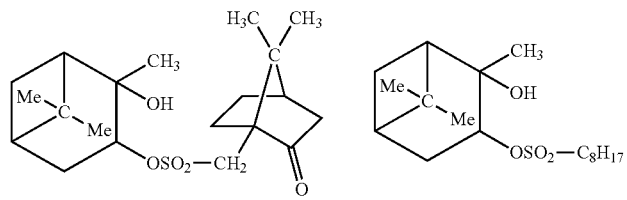
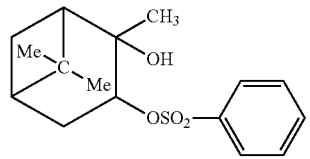

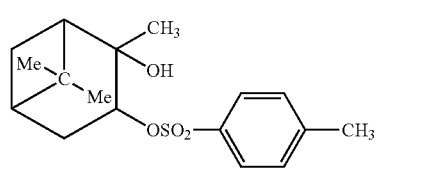
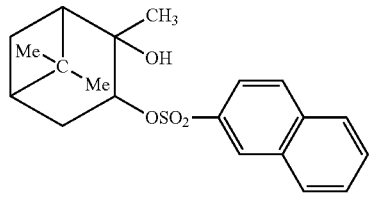
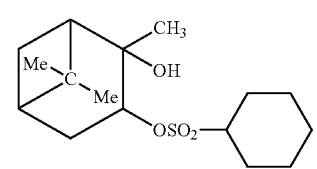

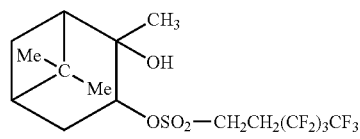
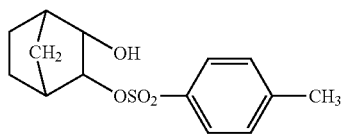
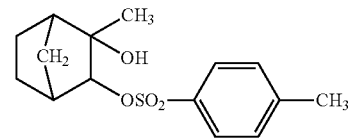

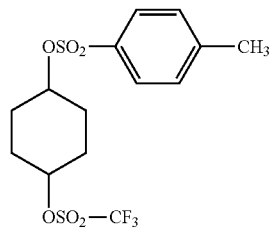
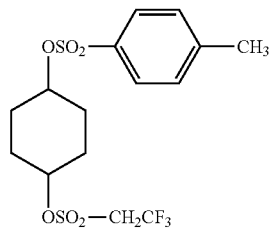
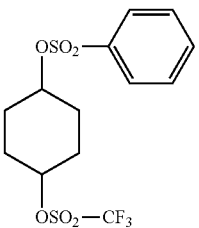
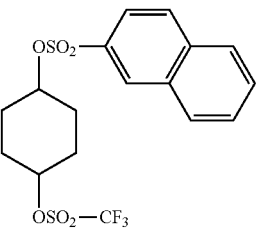

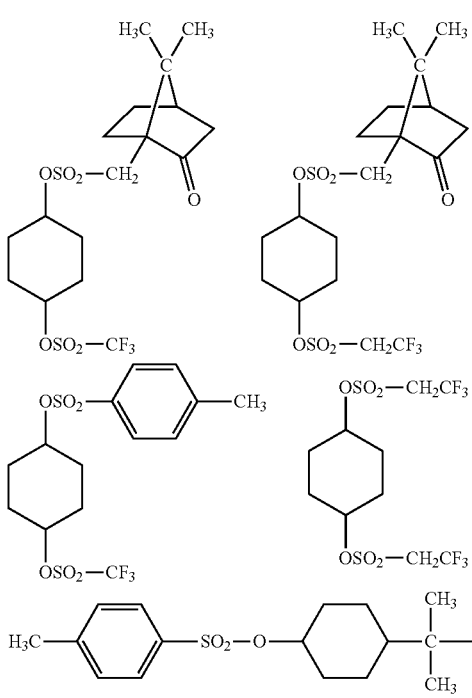
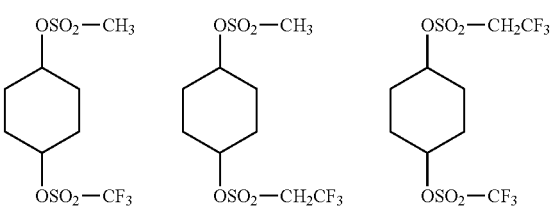
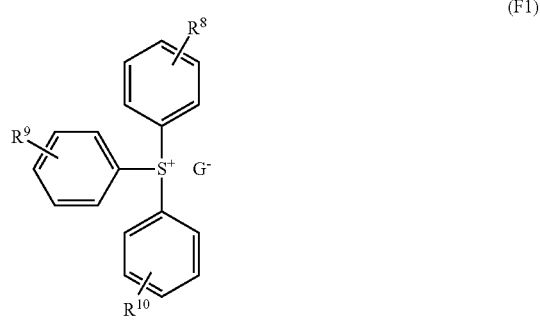

The acid amplifier is preferably used in an amount of 0 to 20 parts by mass, and more preferably 1 to 10 parts by mass, based on 100 parts by mass of the polymer [B], from the viewpoint of improving the sensitivity of the photoresist composition (I). If the acid amplifier is used in an amount of less than the lower limit, the sensitivity of the photoresist composition (I) may decrease. If the acid amplifier is used in an amount of more than the upper limit, the pattern-forming capability of the photoresist composition (I) may deteriorate.

Polar Group-Containing Alicyclic Compound

The polar group-containing alicyclic compound is a compound that includes an alicyclic structure, and at least one group chosen selected from the group consisting of a carboxyl group, a group that produces a carboxyl group due to the effect of an acid, and a group that includes a lactone structure, and has a molecular weight of 1000 or less. The polar group-containing alicyclic compound suppresses surface roughness of the resist pattern formed using the photoresist composition (I), and improves the lithographic performance (e.g., the circularity of a hole pattern, or sensitivity). The above effects are more advantageously achieved when forming a negative-tone resist pattern using a developer that includes an organic solvent.

Examples of the polar group-containing alicyclic compound include adamantane derivatives including a carboxyl group, such as 1-adamantanecarboxylic acid; adamantane derivatives including a group that produces a carboxyl group due to the effect of an acid, such as 2,5-bis(1-adamantyl-carbonyloxy)-2,5-dimethylhexane; norbornane derivatives including a group that produces a carboxyl group due to the effect of an acid, such as 2-hydroxy-6-methoxycarbonylnor-bornanelactone; steroid derivatives including a group that produces a carboxyl group due to the effect of an acid, such as t-butoxycarbonylmethyl 3,12-dihydroxycholanoate and t-butoxycarbonylmethyl 3-hydroxycholanoate; and the like.

The polar group-containing alicyclic compound is preferably used in an amount of 0 to 10 parts by mass, more preferably 0.1 to 8 parts by mass, still preferably 0.5 to 7 parts by mass, and particularly preferably 1 to 6 parts by mass, based on 100 parts by mass of the polymer [B]. If the polar group-containing alicyclic compound is used in an amount of more than the upper limit, the pattern-forming capability of the photoresist composition (I) may deteriorate.

Acid Diffusion Controller

Since the polymer [B] includes the group (a) that forms a cationic group together with a proton, and controls diffusion of the acid generated by the acid generator [A], the photoresist composition (I) need not necessarily include the acid diffusion controller. However, the photoresist composition (I) may optionally include the acid diffusion controller.

Examples of the acid diffusion controller include amine compounds such as mono(cyclo)alkylamines, di(cyclo)alkylamines, tri(cyclo)alkylamines, alkylanilines, diamines, and triamines; amide group-containing compounds such as N-t-alkyloxycarbonyl group-containing amino compounds and amides; urea compounds such as urea and methylurea; nitrogen-containing heterocyclic compounds such as imidazoles, pyridines, and piperazines; photodegradable bases such as an onium salt compound represented by the following formula (F1) or (F2); and the like.

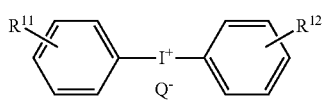

(F2)

wherein $R^8$ to $R^{12}$ are independently a hydrogen atom, an alkyl group, an alkoxy group, a hydroxyl group, or a halogen atom, $G^-$ and $Q^-$ are independently $OH^-$, $R^B\text{---}COO^-$, or $R^B\text{---}SO_3^-$, and $R^B$ is an alkyl group, an aryl group, an alkaryl group, or an anion represented by the following formula (F3).

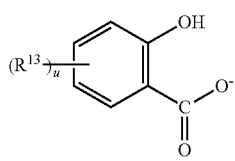

(F3)

wherein $R^{13}$ is a linear or branched alkyl group having 1 to 12 carbon atoms wherein some or all of the hydrogen atoms are optionally substituted with a fluorine atom, or a linear or branched alkoxy group having 1 to 12 carbon atoms, and u is an integer from 0 to 2.

Examples of the acid diffusion controller include the compounds respectively represented by the following formulas, and the like.

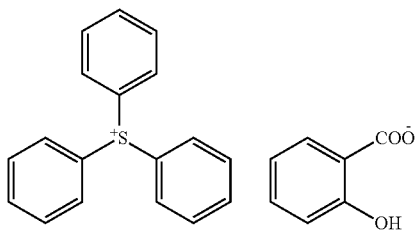

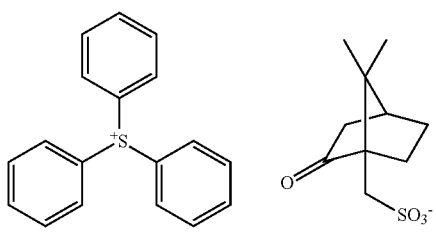

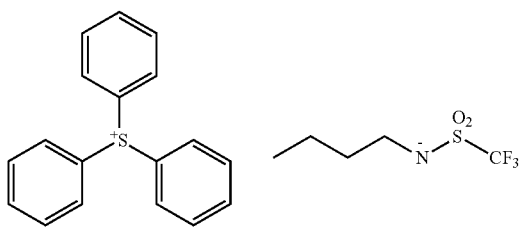

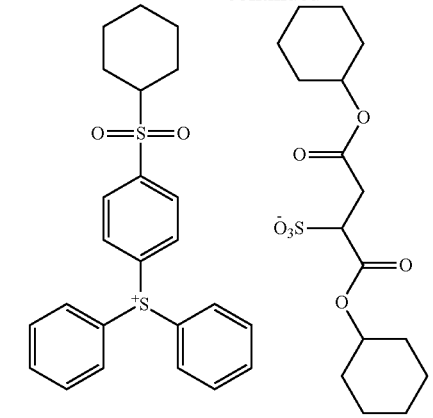

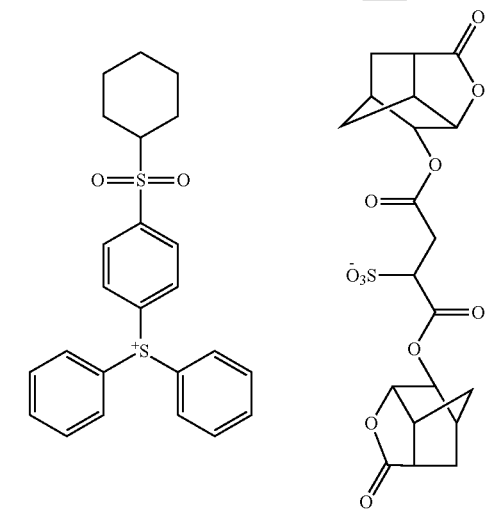

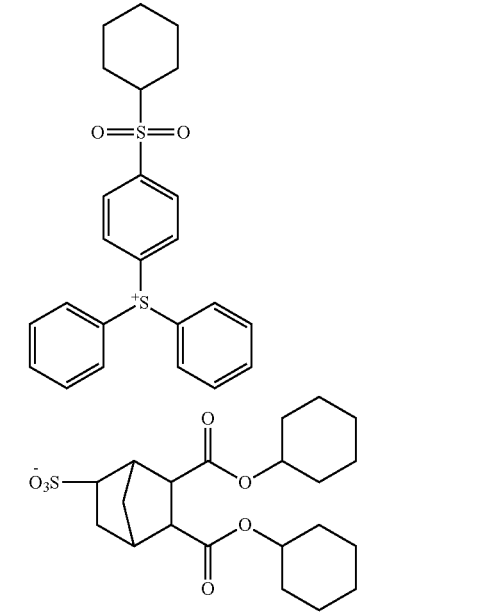

The acid diffusion controller is preferably used in an amount of less than 10 parts by mass, and more preferably less than 8 parts by mass, based on 100 parts by mass of the polymer [B]. If the acid diffusion controller is used in an amount of more than the upper limit, the sensitivity of the photoresist composition (I) may decrease.

Surfactant

The surfactant improves the applicability, the striation resistance, the developability, and the like of the photoresist composition (I). Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and the like. Examples of a commercially available product of the surfactant include KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like.

Sensitizer

The sensitizer increases the amount of acid generated by the acid generator [A], and improves the apparent sensitivity of the photoresist composition (I).

Examples of the sensitizer include carbazoles, acetophenones, benzophenones, naphthalenes, phenols, biacetyl, eosine, rose bengal, pyrenes, anthracenes, phenothiazines, and the like.

Preparation of Photoresist Composition

The photoresist composition (I) may be prepared by mixing the acid generator [A], the polymer [B], the fluorine atom-containing polymer [C], an optional additional component, and the solvent [D] in a given ratio, for example. A mixture thus prepared is preferably filtered through a filter having a pore size of about 0.2 μm, for example. The solid content in the photoresist composition (I) is preferably 0.1 to 50 mass %, more preferably 0.5 to 25 mass %, and still more preferably 1 to 10 mass %.

EXAMPLES

The invention is further described below by way of examples. Note that the invention is not limited to the following examples. The property values were measured using the following methods.

$^{13}$C-NMR Analysis

The polymer was subjected to $^{13}$C-NMR analysis using a nuclear magnetic resonance spectrometer ("JNM-EX270" manufactured by JEOL Ltd.).

Mw and Mn

The Mw and the Mn of the fluorine atom-containing polymer [C] were determined by GPC using GPC columns manufactured by Tosoh Corporation (G2000HXL×2, G3000HXL×1, G4000HXL×1) (flow rate: 1.0 ml/min, eluant: tetrahydrofuran, column temperature: 40° C., standard: monodisperse polystyrene).

Synthesis of Polymer [B]

The following monomers were used to synthesize the polymer [B].

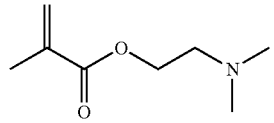
(M-1)

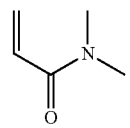
(M-2)

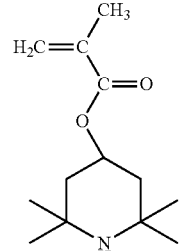
(M-3)

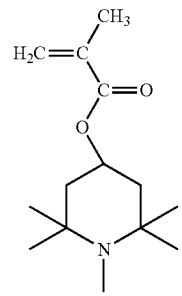
(M-4)

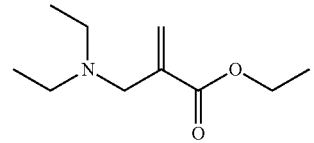
(M-5)

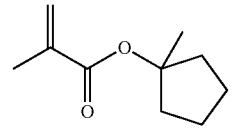
(M-6)

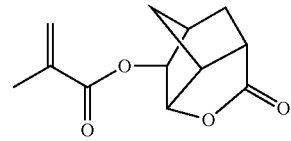
(M-7)

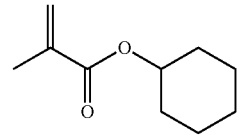
(M-8)

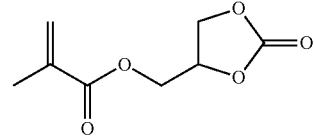
(M-9)

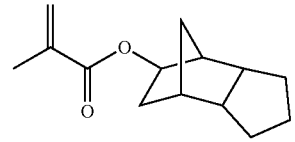
(M-10)

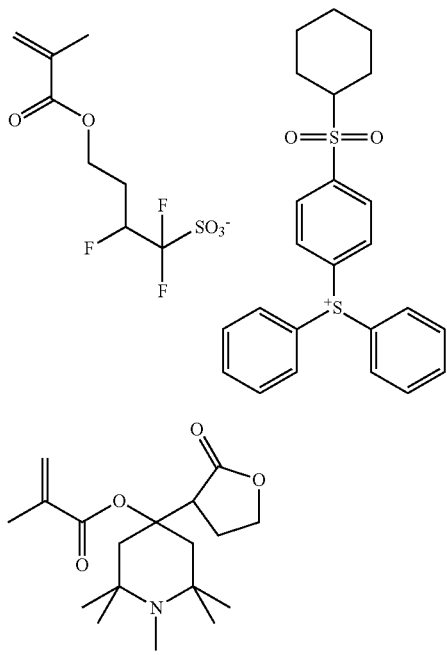

(M-11)

(M-12)

Synthesis of Polymer [B]

Synthesis Example 1

4.75 g (25 mol %) of the monomer (M-1) and 15.25 g (75 mol %) of the monomer (M-8) were dissolved in 40 g of 2-butanone, and 0.40 g (2 mol % based on the total number of moles of the monomers) of AIBN (initiator) was dissolved in the solution to prepare a monomer solution. A three-necked flask (200 mL) charged with 20 g of 2-butanone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, and poured into 400 g of methanol, and a white powder (precipitate) was filtered off. The white powder was washed twice with 80 g of methanol in a slurry state, filtered off, and dried at 50° C. for 17 hours to obtain a white powdery polymer (B-1). The ratio of the content of structural units derived from the monomer (M-1) to the content of structural units derived from the monomer (M-8) in the polymer (B-1) determined by $^{13}$C-NMR analysis was 27:73 (mol %).

Synthesis Examples 2 to 13

Polymers (B-2) to (B-11), (b-1), and (b-2) were synthesized in the same manner as in Synthesis Example 1, except that the monomers shown in Table 1 were used in the ratio (mol %) shown in Table 1. The content of each structural unit in each polymer is also shown in Table 1.

TABLE 1

| | Polymer [B] | Type | Ratio of monomer (mol %) | Content of structural Unit (mol %) |
|---|---|---|---|---|
| Synthesis Example 1 | B-1 | M-1 | 25 | 27 |
| | | M-8 | 75 | 73 |
| Synthesis Example 2 | B-2 | M-2 | 25 | 26 |
| | | M-8 | 75 | 74 |
| Synthesis Example 3 | B-3 | M-3 | 25 | 27 |
| | | M-8 | 75 | 73 |
| Synthesis Example 4 | B-4 | M-4 | 25 | 28 |
| | | M-8 | 75 | 72 |
| Synthesis Example 5 | B-5 | M-5 | 25 | 25 |
| | | M-8 | 75 | 75 |
| Synthesis Example 6 | B-6 | M-1 | 50 | 48 |
| | | M-8 | 30 | 29 |
| | | M-9 | 20 | 23 |
| Synthesis Example 7 | B-7 | M-3 | 50 | 52 |
| | | M-7 | 50 | 48 |
| Synthesis Example 8 | B-8 | M-3 | 40 | 42 |
| | | M-7 | 60 | 58 |
| Synthesis Example 9 | B-9 | M-1 | 10 | 12 |
| | | M-3 | 40 | 41 |
| | | M-7 | 50 | 47 |
| Synthesis Example 10 | B-10 | M-3 | 70 | 72 |
| | | M-11 | 20 | 21 |
| | | M-7 | 10 | 7 |
| Synthesis Example 11 | B-11 | M-12 | 100 | 100 |
| Synthesis Example 12 | b-1 | M-6 | 50 | 49 |
| | | M-7 | 50 | 51 |
| Synthesis Example 13 | b-2 | M-6 | 40 | 40 |
| | | M-7 | 50 | 50 |
| | | M-10 | 10 | 10 |

Synthesis of Fluorine Atom-Containing Polymer [C]

The following monomers were used to synthesize the fluorine atom-containing polymer [C].

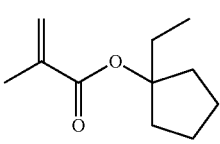

(M-13)

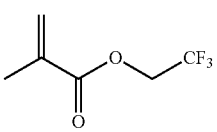

(M-14)

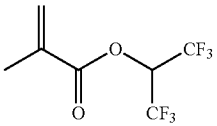

(M-15)

-continued (M-16)
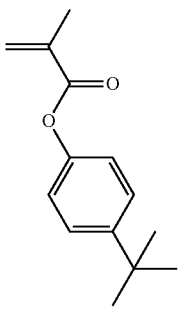

(M-17)
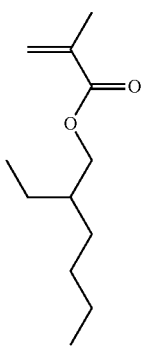

(M-18)
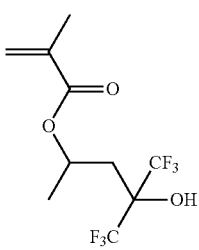

(M-19)
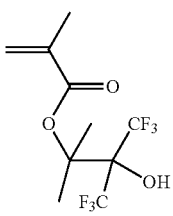

(M-20)
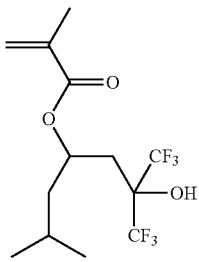

Synthesis Example 14

35.8 g (70 mol %) of the monomer (M-13) and 14.2 g (30 mol %) of the monomer (M-14) were dissolved in 100 g of 2-butanone, and 5.17 g of dimethyl 2,2'-azobisisobutyrate was dissolved in the solution to prepare a monomer solution. A three-necked flask (500 mL) charged with 20 g of 2-butanone was purged with nitrogen for 30 minutes, and heated to 80° C. with stirring. The monomer solution was added dropwise to the flask over 3 hours using a dropping funnel. The monomers were polymerized for 6 hours from the start of addition of the monomer solution. After completion of polymerization, the polymer solution was cooled with water to 30° C. or less, transferred to a separating funnel (2 L), and homogeneously diluted with 150 g of n-hexane. After the addition of 600 g of methanol, the mixture was stirred. After the addition of 30 g of distilled water, the mixture was stirred, and allowed to stand for 30 minutes. After collecting the lower layer, 117 g of propylene glycol monomethyl ether acetate was added to the lower layer to obtain a 30 mass % solution of a polymer (C-1). The polymer (C-1) had an Mw of 7000 and a dispersity (Mw/Mn) of 1.60. The ratio of the content of structural units derived from the monomer (M-13) to the content of structural units derived from the monomer (M-14) in the polymer (C-1) determined by $^{13}$C-NMR analysis was 73:27 (mol %).

Polymers (C-2) to (C-4) were synthesized in the same manner as in Synthesis Example 14, except that the monomers shown in Table 2 were used in the ratio (mol %) shown in Table 2. The Mw and the dispersity (Mw/Mn) of each polymer, and the content (mol %) of each structural unit in each polymer are also shown in Table 2.

TABLE 2

| | Fluorine atom-containing polymer [C] | Type | Ratio of monomer (mol %) | Content of structural unit (mol %) | Mw | Mw/Mn |
|---|---|---|---|---|---|---|
| Synthesis Example 14 | C-1 | M-13 | 70 | 73 | 7000 | 1.60 |
| | | M-14 | 30 | 27 | | |
| Synthesis Example 15 | C-2 | M-15 | 30 | 26 | 5000 | 1.40 |
| | | M-16 | 60 | 62 | | |
| | | M-17 | 10 | 12 | | |
| Synthesis Example 16 | C-3 | M-13 | 50 | 50 | 6500 | 1.50 |
| | | M-15 | 40 | 40 | | |
| | | M-18 | 10 | 10 | | |
| Synthesis Example 17 | C-4 | M-19 | 50 | 52 | 8900 | 1.89 |
| | | M-20 | 50 | 48 | | |

Preparation of Photoresist Composition

The details of the acid generator [A] and the solvent [D] used to prepare the photoresist composition are shown below.

Acid Generator [A]

A-1: triphenylsulfonium 6-(adamantan-1-ylcarbonyloxy)-1,1,2,2-tetrafluoro-n-hexanesulfonate (compound represented by the following formula (A-1))

A-2: triphenylsulfonium 2-(bicyclo[2.2.1]hept-2-yl)-1,1-difluoroethanesulfonate (compound represented by the following formula (A-2))

A-3: 4-cyclohexylphenyldiphenylsulfonium nonafluorobutanesulfonate (compound represented by the following formula (A-3))

A-4: triphenylsulfonium nonafluorobutanesulfonate (compound represented by the following formula (A-4))

A-5: triphenylsulfonium 2-(adamantan-1-ylcarbonyloxy)-1,1,3,3,3-pentafluoropropanesulfonate (compound represented by the following formula (A-5))

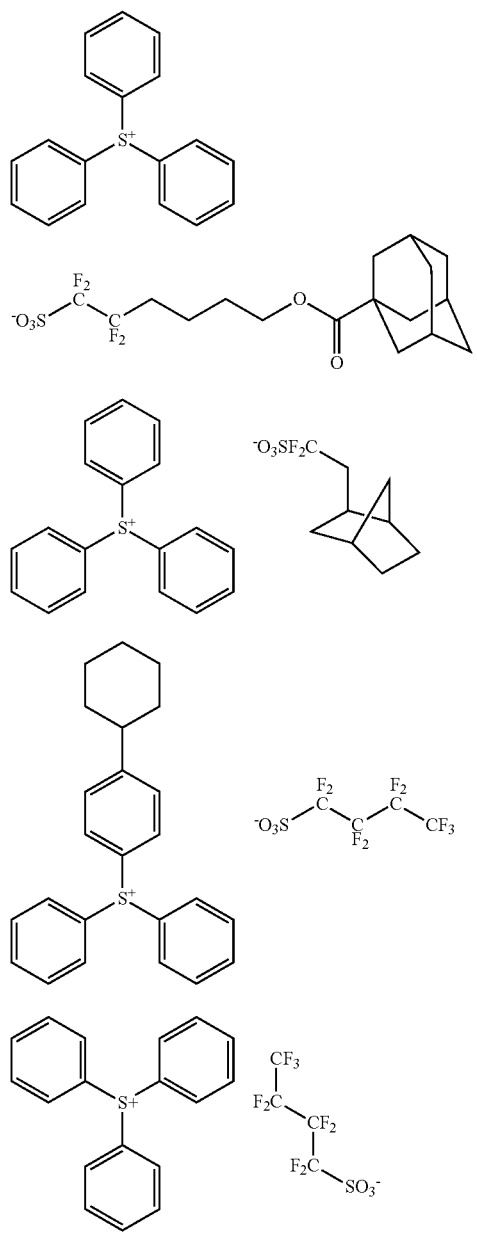

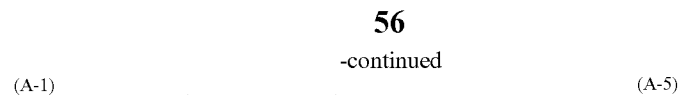

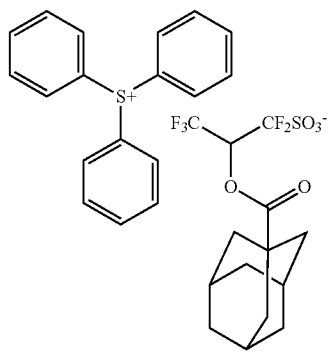

Solvent [D]

D-1: propylene glycol monomethyl ether acetate
D-2: cyclohexanone
D-3: γ-butyrolactone Example 1

10.8 parts by mass of the acid generator (A-1) (acid generator [A]), 100 parts by mass of the polymer (B-1) (polymer [B]), 3 parts by mass of the polymer (C-1) (polymer [C]), 1972 parts by mass of the solvent (D-1) (solvent [D]), 845 parts by mass of the solvent (D-2) (solvent [D]), and 30 parts by mass of the solvent (D-3) (solvent [D]) were mixed to prepare a homogeneous solution. The solution was filtered through a membrane filter having a pore size of 0.2 μm to prepare a photoresist composition.

Examples 2 to 11 and Comparative Examples 1 and 2

A photoresist composition was prepared in the same manner as in Example 1, except that the type and the amount of each component were changed as shown in Table 3. In Table 3, "-" (see the acid generator [A] in Example 10) means that the acid generator [A] was included in the polymer [B].

TABLE 3

| | Acid generator [A] | | Polymer [B] | | Fluorine atom-containing polymer [C] | | Solvent [D] | |
|---|---|---|---|---|---|---|---|---|
| | Type | Amount (parts by mass) | Type | Amount (parts by mass) | Type | Amount (parts by mass) | Type | Amount (parts by mass) |
| Example 1 | A-1 | 10.8 | B-1 | 100 | C-1 | 3 | D-1/D-2/D-3 | 1972/845/30 |
| Example 2 | A-2 | 10.8 | B-2 | 100 | C-2 | 3 | D-1/D-2/D-3 | 1972/845/30 |
| Example 3 | A-3 | 10.8 | B-3 | 100 | C-3 | 3 | D-1/D-2/D-3 | 1972/845/30 |
| Example 4 | A-4 | 10.8 | B-4 | 100 | C-4 | 3 | D-1/D-2/D-3 | 1972/845/30 |
| Example 5 | A-5 | 10.8 | B-5 | 100 | C-4 | 3 | D-1/D-2/D-3 | 1972/845/30 |
| Example 6 | A-1 | 10.8 | B-6 | 100 | C-1 | 3 | D-1/D-2/D-3 | 1972/845/30 |
| Example 7 | A-4 | 16 | B-7 | 100 | C-1 | 3 | D-1/D-2/D-3 | 1972/845/30 |
| Example 8 | A-4 | 32 | B-8 | 100 | C-1 | 3 | D-1/D-2/D-3 | 1972/845/30 |
| Example 9 | A-4 | 32 | B-9 | 100 | C-1 | 3 | D-1/D-2/D-3 | 1972/845/30 |
| Example 10 | — | — | B-10 | 100 | C-1 | 3 | D-1/D-2/D-3 | 1972/845/30 |
| Example 11 | A-4 | 32 | B-11 | 100 | C-1 | 3 | D-1/D-2/D-3 | 1972/845/30 |

TABLE 3-continued

| | Acid generator [A] | | Polymer [B] | | Fluorine atom-containing polymer [C] | | Solvent [D] | |
|---|---|---|---|---|---|---|---|---|
| | Type | Amount (parts by mass) | Type | Amount (parts by mass) | Type | Amount (parts by mass) | Type | Amount (parts by mass) |
| Comparative Example 1 | A-1 | 10.8 | b-1 | 100 | C-1 | 3 | D-1/D-2/D-3 | 1972/845/30 |
| Comparative Example 2 | A-1 | 10.8 | b-2 | 100 | C-1 | 3 | D-1/D-2/D-3 | 1972/845/30 |

Formation of Resist Pattern

An underlayer antireflective film composition ("ARC66" manufactured by Brewer Science) was spin-coated onto a 12-inch silicon wafer using a spin coater ("CLEAN TRACK Lithius Pro i" manufactured by Tokyo Electron Ltd.), and baked at 205° C. for 60 seconds to form an underlayer antireflective film (thickness: 0.105 μm). The photoresist composition was applied to the underlayer antireflective film using the spin coater, prebaked (PB) at 90° C. for 60 seconds, and cooled at 23° C. for 30 seconds to form a resist film having a thickness of 0.100 μm. The resist film was exposed using an ArF immersion scanner ("NSR-S610C" manufactured by Nikon Precision Inc.) under the best focus conditions (NA: 1.3, quadrupole). The resist film was subjected to ¼ projection exposure. The size on the reticle was 0.220 μm chromium/0.440 μm pitch, and the mask bias was 0 nm. The resist film was subjected to post-exposure bake (PEB) for 60 seconds at the temperature shown in Table 4 on the hot plate of the spin coater, and cooled at 23° C. for 30 seconds. The resist film was puddle-developed for 30 seconds using the developer shown in Table 4, and rinsed with 4-methyl-2-pentanol for 7 seconds. The resist film was then spin-dried at 2000 rpm for 15 seconds to form a 0.055 μm hole/0.110 μm pitch resist pattern.

Evaluation

Each resist pattern formed as described above was evaluated as described below. The evaluation results are shown in Table 4.

EL Performance

A dose at which a hole pattern having a diameter of 0.055 μm and a pitch of 0.110 μm was formed by reduction projection exposure through an immersion liquid (water) and a mask having a dot pattern formed so that a hole pattern having a diameter of 0.055 μm and a pitch of 0.110 μm was obtained, was taken as an optimum dose. The ratio of the dose at which the diameter of the hole pattern was within ±10% relative to 0.055 μm, to the optimum dose was taken as the exposure latitude (EL) (%). The results are shown in Table 4. It was determined that a change in patterning capability with respect to a change in dose was small when the EL value was large.

MEEF Performance

A hole pattern having a pitch of 0.110 μm was formed at the optimum dose by exposing the resist film through a mask pattern designed so that the target size of a hole pattern formed by reduction projection exposure was 0.051 μm, 0.053 μm, 0.057 μm, or 0.059 μm. A graph was drawn by plotting the target size (μm) of the hole pattern formed by reduction projection exposure (horizontal axis) and the size (μm) of the hole pattern formed by reduction projection exposure (vertical axis), and the slope of the straight line of the graph was calculated, and taken as the MEEF performance. The results are shown in Table 4. The MEEF performance is close to 1 when the mask reproducibility is good. A case where the MEEF performance was 1.1 or more and less than 4.0 was evaluated as "Acceptable", and a case where the MEEF performance was 4.0 or more was evaluated as "Unacceptable".

Resolution

The resist film was subjected to reduction projection exposure through an immersion liquid (water) and a mask designed so that the resulting pattern had a pitch of 0.104 μm. The minimum dimension of the hole was measured while increasing the dose, and taken as the resolution. The resolution was evaluated as "A" (acceptable) when the minimum dimension of the hole was 0.045 μm or less, and evaluated as "B" (unacceptable) when the minimum dimension of the hole was more than 0.045 μm.

TABLE 4

| | PEB temp. (° C.) | Developer | EL performance (%) | MEEF performance | Resolution |
|---|---|---|---|---|---|
| Example 1 | 85 | Cyclooctane | 17.3 | 3.5 | A |
| | 85 | Diisoamyl ether | 16.9 | 3.8 | A |
| Example 2 | 85 | Cyclooctane | 16.5 | 3.4 | A |
| | 85 | Diisoamyl ether | 15.8 | 3.8 | A |
| Example 3 | 85 | Cyclooctane | 15.5 | 3.9 | A |
| | 85 | Diisoamyl ether | 15.0 | 3.8 | A |
| Example 4 | 85 | Cyclooctane | 15.6 | 3.7 | A |
| | 85 | Diisoamyl ether | 14.7 | 3.9 | A |
| Example 5 | 85 | Cyclooctane | 15.4 | 3.8 | A |
| | 85 | Diisoamyl ether | 15.1 | 3.8 | A |
| Example 6 | 85 | Butyl acetate | 16.8 | 3.7 | A |
| | 85 | Methyl amyl ketone | 16.4 | 3.7 | A |
| Example 7 | 85 | Butyl acetate | 15.8 | 3.8 | A |
| | 85 | Methyl amyl ketone | 17.1 | 3.8 | A |
| Example 8 | 85 | Butyl acetate | 16.2 | 3.8 | A |
| | 85 | Methyl amyl ketone | 17.3 | 3.8 | A |

TABLE 4-continued

| | PEB temp. (° C.) | Developer | EL performance (%) | MEEF performance | Resolution |
|---|---|---|---|---|---|
| Example 9 | 85 | Butyl acetate | 15.8 | 3.7 | A |
| | 85 | Methyl amyl ketone | 16.9 | 3.7 | A |
| Example 10 | 85 | Butyl acetate | 16.3 | 3.7 | A |
| | 85 | Methyl amyl ketone | 17.1 | 3.7 | A |
| Example 11 | 85 | Butyl acetate | 17.3 | 3.8 | A |
| | 85 | Methyl amyl ketone | 17.4 | 3.8 | A |
| Comparative Example 1 | 105 | Butyl acetate | 10.9 | 4.4 | B |
| | 105 | Methyl amyl ketone | 11.2 | 4.4 | B |
| Comparative Example 2 | 105 | Butyl acetate | 9.1 | 4.5 | B |
| | 105 | Methyl amyl ketone | 9.3 | 4.5 | B |

As is clear from the results shown in Table 4, it was confirmed that the photoresist compositions of Examples 1 to 11 exhibited excellent EL performance, excellent MEEF performance, and high resolution.

The resist pattern-forming method and the photoresist composition according to the embodiments of the invention can form a resist pattern that exhibits excellent EL performance, excellent MEEF performance, and high resolution. Therefore, the resist pattern-forming method and the photoresist composition can suitably be used in the field of semiconductor devices (semiconductor process) that will be increasingly scaled down in the future, and can form a finer pattern in higher yield.

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-forming method comprising:
   forming a resist film which is made from a photoresist composition;
   exposing the resist film; and
   developing the exposed resist film using a developer which comprises an organic solvent to form a negative-tone resist pattern,
   the photoresist composition comprising:
      an acid generator capable of generating a protonic acid that generates a proton, upon application of exposure light;
      a polymer which comprises structural unit comprising a cationic-group-forming group capable of forming a cationic group with the proton generated from the protonic acid; and
      a solvent,
   wherein the polymer substantially does not comprise a structural unit which comprises an acid-labile group,
   the polymer does not comprise a fluorine atom or a silicon atom, and
   a content of the structural unit comprising the cationic-group-forming group in the polymer is at least 15 mol % based on total structural units included in the polymer.

2. The resist pattern-forming method according to claim 1, wherein the cationic-group-forming group comprises a nitrogen atom having an unshared electron pair, a phosphorus atom having an unshared electron pair, or both thereof.

3. The resist pattern-forming method according to claim 1, wherein the cationic-group-forming group is at least one group selected from a group consisting of a group represented by formula (a-1), a group represented by formula (a-2), and a group represented by formula (a-3),

wherein
   each Z is independently a nitrogen atom or a phosphorus atom;
   R and R' are each independently a hydrogen atom or a monovalent organic group having 1 to 20 carbon atoms, or R and R' taken together represent a cyclic structure together with Z to which R and R' are bonded; and
   R" is a hydrogen atom or a monovalent organic group having 1 to 20 carbon atoms.

4. The resist pattern-forming method according to claim 3, wherein the group represented by the formula (a-1) is at least one group selected from a group consisting of a group represented by formula (a-1-1), a group represented by formula (a-1-2), a group represented by formula (a-1-3), a group represented by formula (a-1-4), a group represented by formula (a-1-5), and a group represented by formula (a-1-6), and the group represented by the formula (a-2) is a group represented by formula (a-2-1),

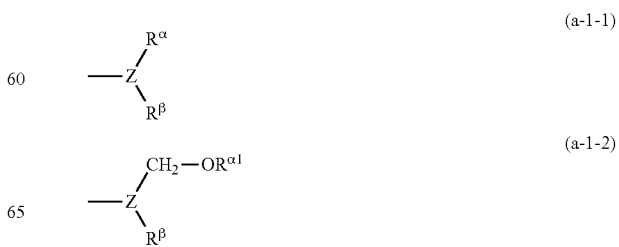

-continued

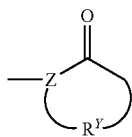
(a-1-3)

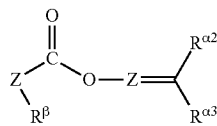
(a-1-4)

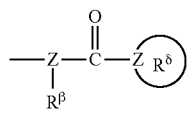
(a-1-5)

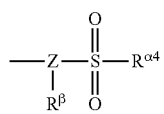
(a-1-6)

(a-2-1)

wherein
  each Z is independently a nitrogen atom or a phosphorus atom;
  in the formula (a-1-1), $R^\alpha$ and $R^\beta$ are each independently a hydrogen atom or a monovalent hydrocarbon group having 1 to 20 carbon atoms, or $R^\alpha$ and $R^\beta$ taken together represent a cyclic structure together with an atom represented by Z;
  in the formula (a-1-2), $R^{\alpha 1}$ and $R^\beta$ are each independently a hydrogen atom or a monovalent hydrocarbon group having 1 to 20 carbon atoms, or $R^{\alpha 1}$ and $R^\beta$ taken together represent a cyclic structure together with an atom represented by Z and —CH$_2$—O—;
  in the formula (a-1-3), $R^\gamma$ is a divalent hydrocarbon group having 1 to 20 carbon atoms or a divalent oxyhydrocarbon group having 1 to 20 carbon atoms;
  in the formula (a-1-4), $R^\beta$ is independently a hydrogen atom or a monovalent hydrocarbon group having 1 to 20 carbon atoms, and $R^{\alpha 2}$ and $R^{\alpha 3}$ are each independently a hydrogen atom or a monovalent hydrocarbon group having 1 to 20 carbon atoms, or $R^{\alpha 2}$ and $R^{\alpha 3}$ taken together represent a cyclic structure together with the carbon atom bonded to $R^{\alpha 2}$ and $R^{\alpha 3}$;
  in the formula (a-1-5), $R^\beta$ is a hydrogen atom or a monovalent hydrocarbon group having 1 to 20 carbon atoms, and $R^\delta$ is a group which forms a substituted or unsubstituted monovalent aromatic heterocyclic group having 3 to 20 carbon atoms together with an atom represented by Z;
  in the formula (a-1-6), $R^\beta$ is a hydrogen atom or a monovalent hydrocarbon group having 1 to 20 carbon atoms, and $R^{\alpha 4}$ is a monovalent hydrocarbon group having 1 to 20 carbon atoms;
  in the formula (a-2-1), $R^\varepsilon$ is a hydrogen atom or a monovalent hydrocarbon group having 1 to 20 carbon atoms.

5. The resist pattern-forming method according to claim 3, wherein the group represented by the formula (a-1) is at least one group selected from a group consisting of a group represented by formula (a-1-1), a group represented by formula (a-1-2), a group represented by formula (a-1-4), a group represented by formula (a-1-5), and a group represented by formula (a-1-6), and the group represented by the formula (a-2) is a group represented by formula (a-2-1),

(a-1-1)

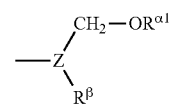
(a-1-2)

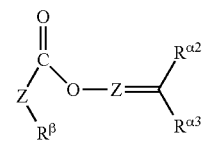
(a-1-4)

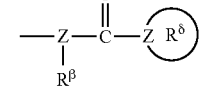
(a-1-5)

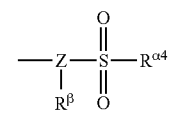
(a-1-6)

(a-2-1)

wherein
  each Z is independently a nitrogen atom or a phosphorus atom;
  in the formula (a-1-1), $R^\alpha$ and $R^\beta$ are each independently a hydrogen atom or a monovalent hydrocarbon group having 1 to 20 carbon atoms, or $R^\alpha$ and $R^\beta$ taken together represent a cyclic structure together with an atom represented by Z;
  in the formula (a-1-2), $R^{\alpha 1}$ and $R^\beta$ are each independently a hydrogen atom or a monovalent hydrocarbon group having 1 to 20 carbon atoms, or $R^{\alpha 1}$ and $R^\beta$ taken together represent a cyclic structure together with an atom represented by Z and —CH$_2$—O—;
  in the formula (a-1-4), $R^\beta$ is independently a hydrogen atom or a monovalent hydrocarbon group having 1 to 20 carbon atoms, and $R^{\alpha 2}$ and $R^{\alpha 3}$ are each independently a hydrogen atom or a monovalent hydrocarbon group having 1 to 20 carbon atoms, or $R^{\alpha 2}$ and $R^{\alpha 3}$ taken together represent a cyclic structure together with the carbon atom bonded to $R^{\alpha 2}$ and $R^{\alpha 3}$;
  in the formula (a-1-5), $R^\beta$ is a hydrogen atom or a monovalent hydrocarbon group having 1 to 20 carbon atoms, and $R^\delta$ is a group which forms a substituted or unsubstituted monovalent aromatic heterocyclic group having 3 to 20 carbon atoms together with an atom represented by Z;
  in the formula (a-1-6), $R^\beta$ is a hydrogen atom or a monovalent hydrocarbon group having 1 to 20 carbon atoms, and $R^{\alpha 4}$ is a monovalent hydrocarbon group having 1 to 20 carbon atoms;

in the formula (a-2-1), $R^\epsilon$ is a hydrogen atom or a monovalent hydrocarbon group having 1 to 20 carbon atoms.

6. The resist pattern-forming method according to claim 1, wherein the structural unit comprising the cationic-group-forming group is represented by formula (1),

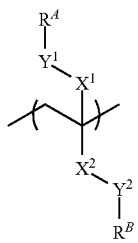
(1)

wherein
$X^1$ and $X^2$ are each independently a single bond, —O—, —C(O)—, —C(O)O—, —OC(O)O—, —C(O)OC(O)—, —C(O)NH—, —OC(O)NH—, or —SO$_3$—;

$Y^1$ and $Y^2$ are each independently a single bond or an (n+1)-valent group represented by $R^C(R^X)((L)_p\text{-*})_n$,
wherein $R^C$ is an (n+2)-valent chain hydrocarbon group having 1 to 15 carbon atoms, $R^X$ is a hydrogen atom or a monovalent organic group having 1 to 20 carbon atoms, L is —O—, —C(O)—, —C(O)O—, —OC(O)O—, —C(O)OC(O)—, —C(O)NH—, —OC(O)NH—, or —SO$_3$—, n is an integer from 1 to 3, and p is 0 or 1, wherein a plurality of p are either identical or different when n is 2 or 3, and a plurality of L are either identical or different when a plurality of L are present;

* is a site bonded to $R^A$ or $R^B$; and $R^A$ and $R^B$ are each independently a hydrogen atom or the cationic-group-forming group having valency of n, wherein a case where all of $X^1$, $Y^1$, $X^2$, and $Y^2$ are a single bond is excluded, and at least one of $R^A$ or $R^B$ is the cationic-group-forming group having valency of n.

7. The resist pattern-forming method according to claim 6, wherein the structural unit comprising the cationic-group-forming group is at least one structural unit selected from a group consisting of a structural unit represented by formula (1-1), a structural unit represented by formula (1-2), a structural unit represented by formula (1-3), and a structural unit represented by formula (1-4),

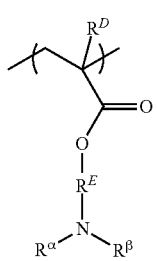
(1-1)

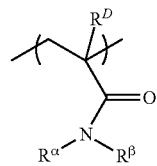
(1-2)

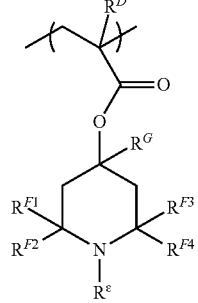
(1-3)

(1-4)

wherein
$R^\alpha$, $R^\beta$, and $R^\epsilon$ are each independently a hydrogen atom or a monovalent hydrocarbon group having 1 to 20 carbon atoms;

$R^D$ is a hydrogen atom or a monovalent chain hydrocarbon group having 1 to 5 carbon atoms;

$R^E$ is a divalent chain hydrocarbon group having 1 to 10 carbon atoms;

$R^{F1}$ to $R^{F4}$ are each independently a hydrogen atom or a monovalent chain hydrocarbon group having 1 to 5 carbon atoms;

$R^G$ is a hydrogen atom or a monovalent organic group having 1 to 20 carbon atoms;

$R^H$ is a single bond or a divalent chain hydrocarbon group having 1 to 10 carbon atoms; and $R^I$ is a monovalent organic group having 1 to 20 carbon atoms.

8. The resist pattern-forming method according to claim 1, wherein the polymer further comprises a structural unit represented by formula (2),

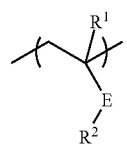
(2)

wherein
$R^1$ is a hydrogen atom or a monovalent hydrocarbon group having 1 to 20 carbon atoms;

E is —O—, —C(O)—, —C(O)O—, —S—, —S(O)—, —S(O)$_2$—, —C(O)S—, or —C(S)O—; and $R^2$ is a non-acid-labile monovalent alicyclic hydrocarbon group having 3 to 20 carbon atoms, wherein some or all of the hydrogen atoms included in the hydrocarbon group represented by $R^1$ and the alicyclic hydrocarbon group represented by $R^2$ are optionally substituted with a chlorine atom, a bromine atom, an iodine atom, a hydroxyl group, a carboxyl group, a nitro group, or an oxo group.

9. The resist pattern-forming method according to claim 1, wherein the organic solvent is at least one organic solvent selected from a group consisting of an alcohol-based solvent, an ether-based solvent, a ketone-based solvent, an amide-based solvent, an ester-based solvent, and a hydrocarbon-based solvent.

* * * * *